(12) United States Patent
Sun et al.

(10) Patent No.: US 10,014,297 B1
(45) Date of Patent: Jul. 3, 2018

(54) METHODS OF FORMING INTEGRATED CIRCUIT STRUCTURE USING EXTREME ULTRAVIOLET PHOTOLITHOGRAPHY TECHNIQUE AND RELATED INTEGRATED CIRCUIT STRUCTURE

(71) Applicant: GLOBALFOUNDRIES INC., Grand Cayman (KY)

(72) Inventors: Lei Sun, Altamont, NY (US); Wenhui Wang, San Jose, CA (US); Xunyuan Zhang, Albany, NY (US); Ruilong Xie, Niskayuna, NY (US); Jia Zeng, Sunnyvale, CA (US); Xuelian Zhu, San Jose, CA (US); Min Gyu Sung, Latham, NY (US); Shao Beng Law, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/589,312

(22) Filed: May 8, 2017

(51) Int. Cl.
| | |
|---|---|
| *H01L 27/088* | (2006.01) |
| *H01L 29/66* | (2006.01) |
| *H01L 21/027* | (2006.01) |
| *H01L 21/8234* | (2006.01) |

(52) U.S. Cl.
CPC ...... *H01L 27/0886* (2013.01); *H01L 21/0274* (2013.01); *H01L 21/823431* (2013.01); *H01L 29/6681* (2013.01)

(58) Field of Classification Search
CPC ......... H01L 27/0886; H01L 21/823431; H01L 29/0274; H01L 29/6681
See application file for complete search history.

(56) References Cited

U.S. PATENT DOCUMENTS

| | | | |
|---|---|---|---|
| 9,236,269 B2 * | 1/2016 | Kozarsky | H01L 21/3086 |
| 9,564,446 B1 * | 2/2017 | Weybright | H01L 21/3065 |
| 9,627,376 B2 * | 4/2017 | Song | H01L 27/10826 |
| 2014/0106528 A1 * | 4/2014 | Quyang | H01L 21/8234 438/275 |
| 2014/0131813 A1 * | 5/2014 | Liaw | H01L 27/1104 257/401 |
| 2016/0254191 A1 * | 9/2016 | Tseng | H01L 21/823431 438/702 |
| 2017/0194149 A1 * | 7/2017 | Chang | H01L 21/2253 |

* cited by examiner

*Primary Examiner* — William Coleman
(74) *Attorney, Agent, or Firm* — Yuanmin Cai; Hoffman Warnick LLC

(57) ABSTRACT

One aspect of the disclosure is directed to a method of forming an integrated circuit structure. The method may include: providing a set of fins over a semiconductor substrate, the set of fins including a plurality of working fins and a plurality of dummy fins, the plurality of dummy fins including a first subset of dummy fins within a pre-defined distance from any of the plurality of working fins, and a second subset of dummy fins beyond the pre-defined distance from any of the plurality of working fins; removing the first subset of dummy fins by an extreme ultraviolet (EUV) lithography technique; and removing at least a portion of the second subset of dummy fins.

20 Claims, 18 Drawing Sheets

METHODS OF FORMING INTEGRATED CIRCUIT STRUCTURE USING EXTREME ULTRAVIOLET PHOTOLITHOGRAPHY TECHNIQUE AND RELATED INTEGRATED CIRCUIT STRUCTURE

BACKGROUND

Technical Field

The present disclosure relates to methods of forming an integrated circuit structure using an extreme ultraviolet (EUV) lithography technique to remove dummy fins that are within a pre-defined distance from working fins within the integrated circuit structure.

Related Art

Although various types of photolithographic processes are known in the art, state of the art semiconductor fabrication processes commonly use "extreme" ultraviolet (EUV) photolithography to form the pre-pattern openings in the photoresist layer. During semiconductor wafer fabrication, extreme ultraviolet (EUV) light can be utilized in a lithographic process to enable transfer of very small patterns, such as nanometer-scale patterns, from an optical mask to a semiconductor wafer. In EUV lithography, a pattern formed on an EUV lithographic mask (also referred to as an EUV "reticle") can be transferred to a semiconductor wafer by reflecting EUV light off of portions of a reflective surface. However, due to the high energy of the EUV light and the roughness of reflected surface, unwanted rays of light can reach areas of the photoresist layer, thereby altering the pattern to be transferred by the mask. As such, one patterning issue that is commonly known in the art and associated with EUV photolithography is the scatter of light as a function of density and change in density of light across a large distance.

In particular, current EUV photolithographic processes typically suffer from a small but measurable amount of scattered light "showering" the regions on the wafer that neighbor the transferred pattern. This phenomenon is also referred to in the art as "EUV flare" or simply "flare." This scattered light is a function of both the density (of polygon shapes drawn) of the area exposed to the EUV light, as well as the change in density across the wafer. This flare effect undesirably alters the final, transferred polygon size from desired (design) values. As such, the designs need to be corrected for the flare effect in order to obtain optimal wafer patterns. EUV flare can scatter light several microns, even millimeters away from the exposed area. Compensation for the flare is commonly achieved by "biasing" the design to counter the global size change associated with the increase in baseline light from flare.

A larger amount of flare may result from using bright field EUV reticle or mask. A bright field reticle includes a mostly clear reflective field with "islands" of the masking absorber material therein. As a comparison, a dark field EUV reticle has smaller flare level than bright field EUV reticle. A dark field reticle includes a mostly dark field, such that a majority of the field includes the masking absorber material, having "holes" or "openings" therein. A positive tone development (PTD) resist is a type of photoresist in which the portion of the photoresist that is exposed to light becomes soluble to the photoresist developer while the unexposed portion of the photoresist remains insoluble to the photoresist developer. A negative tone development (NTD) resist is a type of photoresist in which the portion of the photoresist that is exposed to light becomes insoluble to the photoresist developer while the unexposed portion of the photoresist is dissolved by the photoresist developer. In some semiconductor process steps, a block pattern needs to be printed with lithography. To print block patterns, either bright field reticle with PTD resist or dark field reticle with NTD resist are used. A bright field reticle with PTD resist suffers from flare in EUV lithography, and EUV lithography using NTD resist is not mature in industry. Therefore, it is difficult to print block patterns with EUV lithography. Additionally, EUV photolithography techniques are expensive to perform.

SUMMARY

A first aspect of the disclosure is directed to a method of forming an integrated circuit structure. The method may include: providing a set of fins over a semiconductor substrate, the set of fins including a plurality of working fins and a plurality of dummy fins, the plurality of dummy fins including a first subset of dummy fins within a pre-defined distance from any of the plurality of working fins, and a second subset of dummy fins beyond the pre-defined distance from any of the plurality of working fins; removing the first subset of dummy fins by an extreme ultraviolet (EUV) lithography technique; and removing at least a portion of the second subset of dummy fins.

A second aspect of the disclosure is directed to a method of forming an integrated circuit structure. The method may include: providing a set of nitride fins over a semiconductor substrate, the set of nitride fins including a plurality of working nitride fins and a plurality of dummy nitride fins; performing an extreme ultraviolet (EUV) lithography technique to remove a first subset of the plurality of dummy nitride fins from over the semiconductor substrate such that a second subset of the plurality of dummy nitride fins and the plurality of working nitride fins remain, wherein the first subset of the plurality of dummy nitride fins is within a pre-defined distance from any of the plurality of working nitride fins and the second subset of the plurality of dummy nitride fins is beyond the pre-defined distance from any of the plurality of working nitride fins; and forming a set of dummy semiconductor fins from the second subset of the plurality of dummy nitride fins and forming a set of active semiconductor fins from the plurality of working nitride fins.

A third aspect of the disclosure is directed to an integrated circuit structure. The semiconductor structure may include: a substrate including a first location having a first height and a second, distinct location having a second height; and a set of semiconductor fins extending from the substrate, wherein the first location of the substrate is devoid of the set of semiconductor fins and the second location of the substrate is disposed between adjacent semiconductor fins of the set of semiconductor fins.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to methods of forming an integrated circuit structure using an extreme ultraviolet (EUV) photolithography technique to remove dummy fins that are within a pre-defined distance from working fins within the integrated circuit structure. A conventional block mask may be used to remove nitride fins which are outside or beyond the pre-defined distance from the working nitride fins. In conventional optical processes, a bright field reticle with a positive tone development (PTD) photoresist or dark field reticle with negative tone development (NTD) photoresist is used to pattern a block including active fins. In EUV processes, a bright field reticle with a PTD photoresist results in high flare and high defectivity. Further, an EUV process using a dark field reticle and an NTD photoresist is not a matured process yet. EUV lithography techniques typically require only one exposure to print a single small pattern, e.g., openings with a pitch of less than approximately 80 nanometers (nm). Conventional block masks or optical lithography techniques require multiple exposures to print a pattern having a pitch of less than approximately 80 nm, and the more exposures required, the greater the overall cost is for fabricating the integrated circuit structure. In 5 nm or smaller technology nodes, fin pitch is much smaller than that in technology nodes of 7 nm and above. This results in the need for multiple patterning steps to define active fins with high resolution. As a result, the present disclosure is directed to methods for forming integrated circuit structures including performing an EUV lithography technique using a dark field reticle and a PTD photoresist in addition to performing a conventional optical lithography technique. The methods disclosed herein result in reduced EUV flare. Additionally, by using the EUV photolithography technique only once during the method, and the less expensive block mask or conventional optical lithography technique for the other lithography process, the overall cost for performing the methods described herein are reduced compared to conventional techniques.

Figure 1:
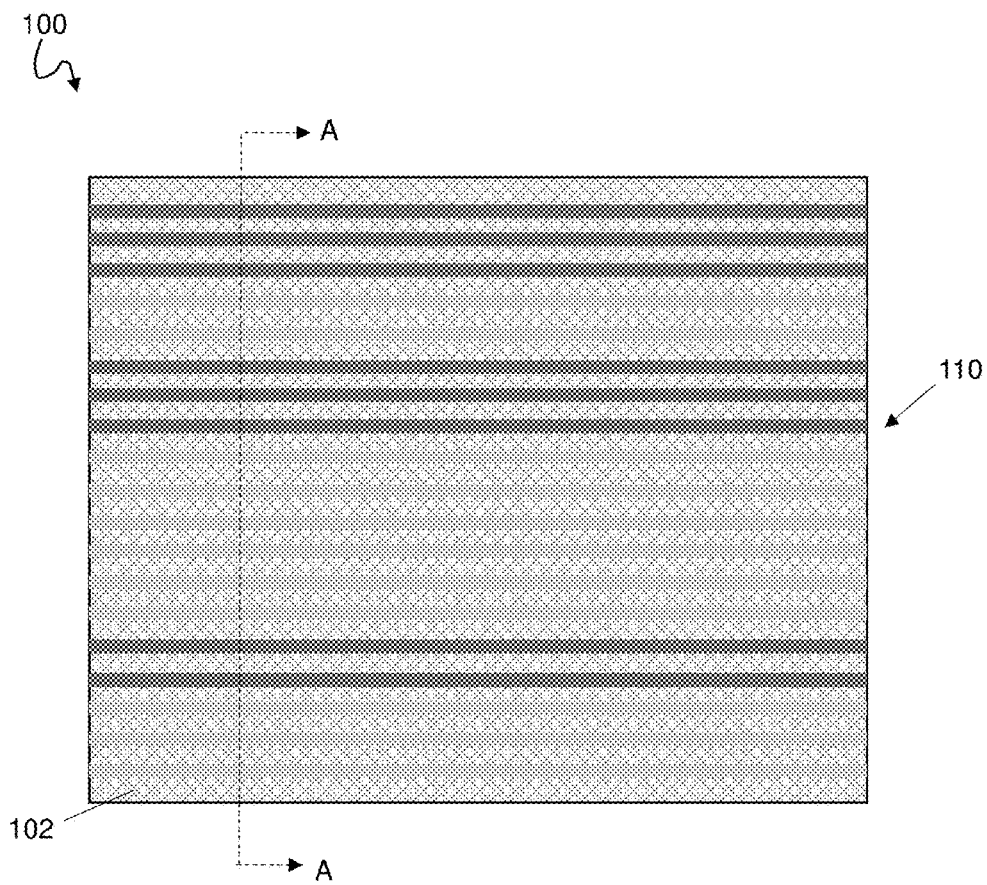
FIGS. 1-18 show an integrated circuit structure undergoing a method according to a first aspect of the disclosure wherein odd numbered figures (e.g., FIGS. 1, 3, 5 . . . 17) show a top-down view of the integrated circuit structure and even numbered figures (e.g., FIGS. 2, 4, 6 . . . 18) show a cross-sectional view of the integrated circuit structure taken along line A-A of the odd numbered figures.
Figure 2:
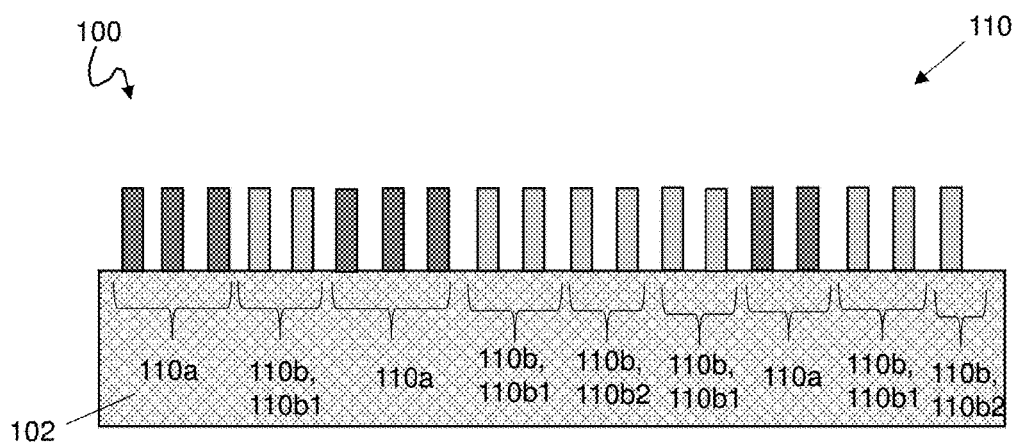

Referring now to FIG. 1, a top down view of a preliminary integrated circuit (IC) structure 100 is shown. FIG. 2 shows a cross-sectional view of IC structure 100 taken along line A-A in FIG. 1. Referring to FIGS. 1 and 2 together, IC structure 100 may include a substrate 102 having a plurality or set of nitride fins 110 formed thereover. Substrate 102 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of substrate 102 may be strained. While substrate 102 is shown as including a single layer of semiconductor material, it is emphasized that the teachings of the disclosure are equally applicable to semiconductor-on-insulator (SOI) substrates. As known in the art, SOI substrates may include a semiconductor layer on an insulator layer on another semiconductor layer (not shown). The semiconductor layers of an SOI substrate may include any of the semiconductor substrate materials discussed herein. The insulator layer of the SOI substrate may include any now known or later developed SOI substrate insulator such as but not limited to silicon oxide.

Nitride fins 110 may be formed, for example, by depositing a nitride layer, e.g., silicon nitride, over substrate 102 and patterning and etching the nitride layer such that nitride fins 110 remain on substrate 102. As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

As used herein "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

As will be described herein, nitride fins 110 may be used as a mask to form semiconductor fins from substrate 102. It is to be understood that any number of nitride fins 110 may be formed on substrate 102 without departing from aspects of the disclosure. As shown, some nitride fins 110 are illustrated in a dark grey color and others are in a light grey color. The dark grey nitride fins 110 (i.e., "working nitride fins" or "working fins" 110*a*) represent nitride fins 110 from which active or desired semiconductor fins may be formed, while the light grey nitride fins 110 (i.e., "dummy nitride fins" or "dummy fins" 110*b*) represent nitride fins 110 which may be desired to be removed from IC structure 100 or from which undesired or dummy semiconductor fins may first be formed and then removed. That is, set of nitride fins 110 may include a plurality or set of dummy nitride fins 110*b* and a plurality or set of working nitride fins 110*a*. Dummy nitride fins 110*b* may further include a first subset 110*b*1 and a second subset 110*b*2. First subset 110*b*1 may include dummy nitride fins 110*b* that are within a pre-defined distance from a working nitride fin 110*a*. Second subset 110*b*2 may include dummy nitride fins 110*b* that are beyond the pre-defined distance from any working nitride fin 110*a*. As will be described herein, the pre-defined distance may be determined by the EUV lithography technique used.

It is to be understood that the orientation and number of nitride fins 110 may be altered depending on the final desired structure including semiconductor fins formed from substrate 102. In addition, the photolithography techniques described herein may be customized depending on where on IC structure 100 it is desired to include active semiconductor fins. It is to be further understood that during the formation of nitride fins 110, only working nitride fins 110*a* may be formed within IC structure 100 to from only active semiconductor fins. However, it may be more efficient or desirable to form both dummy nitride fins 110*b* and working nitride fins 110*a* having a substantially uniform pitch within IC structure 100, and removing dummy nitride fins 110*b* thereafter. The present disclosure is directed to such an embodiment.

Figure 3:
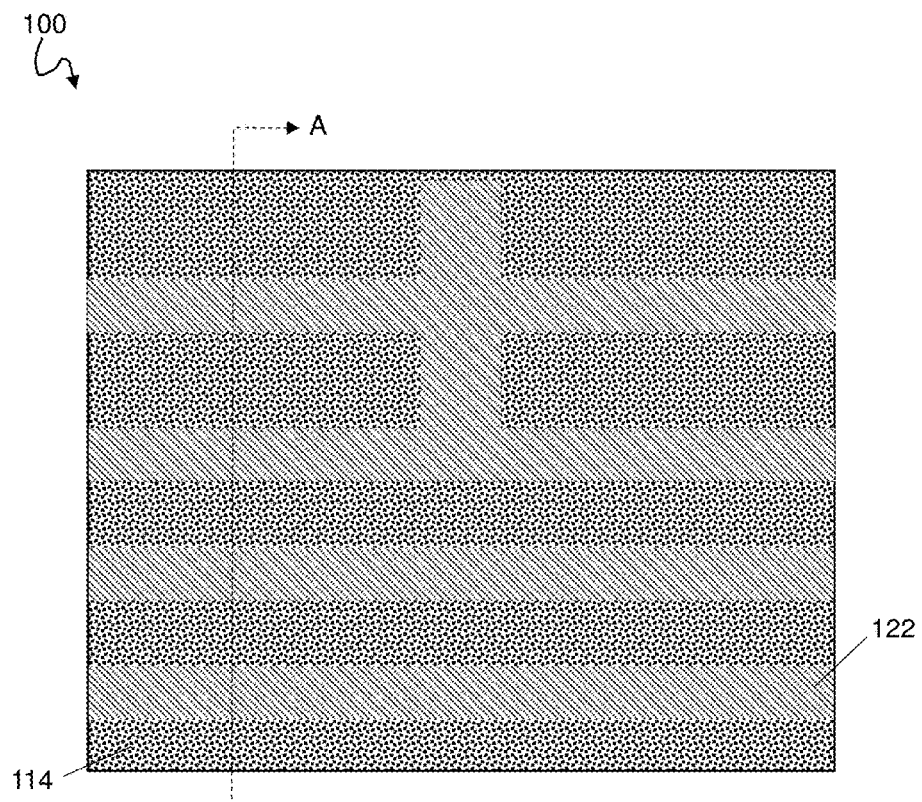
Figure 4:
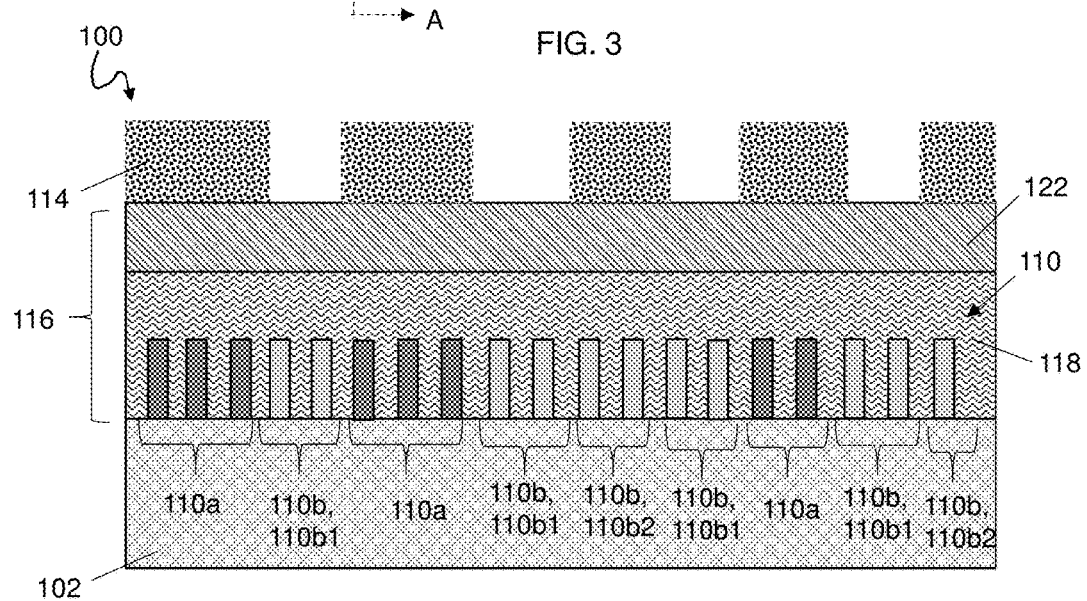

As shown in FIGS. 3-10, a first lithography technique may be performed to expose and remove first subset 110*b*1 of dummy nitride fins 110*b* within a first mask 116 over substrate 102. The first lithography technique may include an EUV lithography technique. EUV lithography techniques use an EUV scanner at a wavelength of about 13.5 nm. As known, EUV lithographic techniques are performed at a much higher cost than conventional lithographic techniques. The EUV lithography technique allows for greater precision and better resolution during the patterning and etching of IC structure 100 having a very small, e.g., less than approximately 80 nm (or ranging from approximately 28 nm to approximately 80 nm), and substantially uniform pitch between nitride fins 110. Therefore, the EUV lithography technique may be used to remove dummy nitride fins 110*b* that are within a pre-defined distance from working nitride fins 110*a*. In such an embodiment, the first lithography technique may include patterning a photoresist 114 to expose portions of first mask 116 under photoresist 114 as shown in FIGS. 3-4. Photoresist 114 is often used as a masking material in photolithographic processes to reproduce either a positive or a negative image on a structure, prior to etching (removal of material which is not masked). The photoresist is usually washed off after having served its purpose as a masking material. Photoresist 114 may include a positive tone development (PTD) resist. The EUV reticle used to expose photoresist 114 may be a dark field reticle (not individually shown herein). As known, a reticle may include a plate, e.g., of quartz, including a pattern delineated therein. The dark field reticle of the EUV lithography technique may determine the pre-defined distance. For example, the EUV lithography technique may be used, together with a dark field reticle, to pattern and etch IC structure 100 including nitride fins 110 having a very small pitch, i.e., less than approximately 80 nm. As such, the pre-defined distance may include a distance of less than approximately 80 nm. That is, the EUV lithography technique may be used to remove first subset 110*b*1 of dummy nitride fins 110*b* that are within approximately 80 nm of working nitride fins 110*a*. Increasing the exposure window for the dark field reticle beyond approximately 80 nm may convert the dark field reticle to a bright field reticle, i.e., more of the field will be uncovered by the reticle than covered by the reticle, thus resulting in the flare issues discussed relative to bright field EUV reticles.

Figure 5:
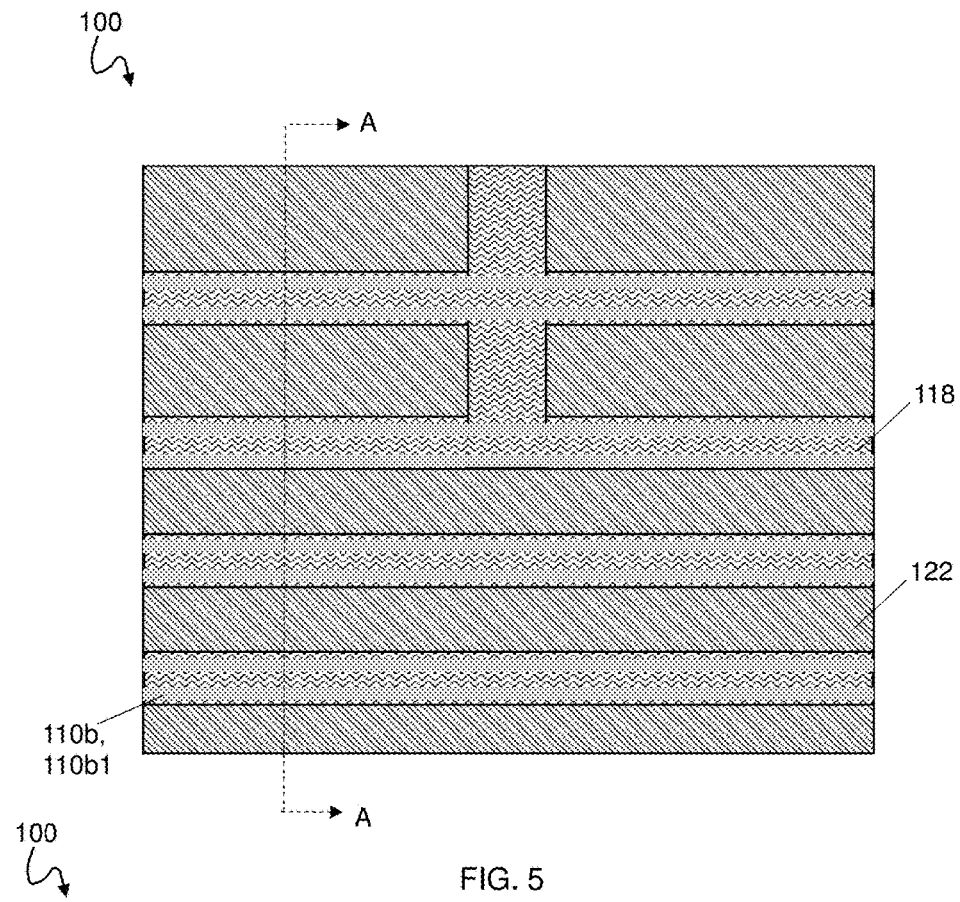
Figure 6:
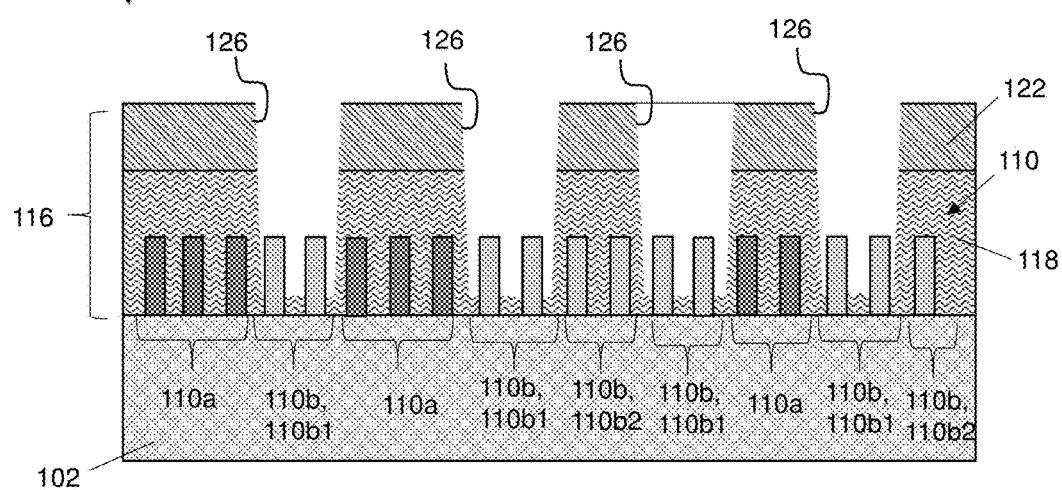

First mask 116 may include an optical planarization layer (OPL) 118 over substrate 102 and nitride fins 110, and an anti-reflective coating layer including silicon (SiARC) 122 over OPL 118. Further, as shown in FIGS. 5-6, the first lithography technique may include forming one or more openings 126 in the exposed portions of first mask 116 to expose first subset 110*b*1 of dummy nitride fins 110*b*. That is, an etch may be performed to transfer the pattern of the photoresist 114 to the underlying OPL 118 and SiARC 122. More specifically, opening(s) 126 may be formed within each of OPL 118 and SiARC 122 to expose first subset 110*b*1 of dummy nitride fins 110*b*. First subset 110*b*1 of dummy nitride fins 110*b* may include nitride fins 110 that are desired to be removed from IC structure 100. In addition, photoresist 114 (FIGS. 3-4) may be stripped or removed to expose first mask 116 (or SiARC 122, more specifically) thereunder.

Figure 7:
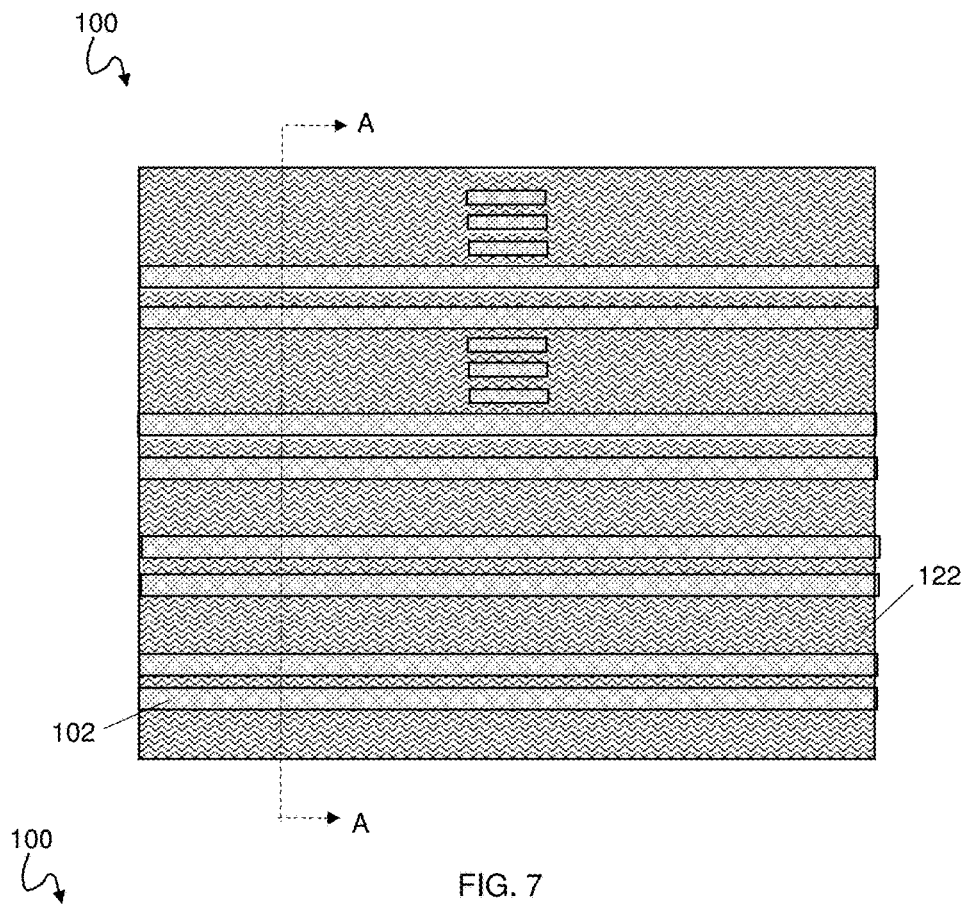
Figure 8:
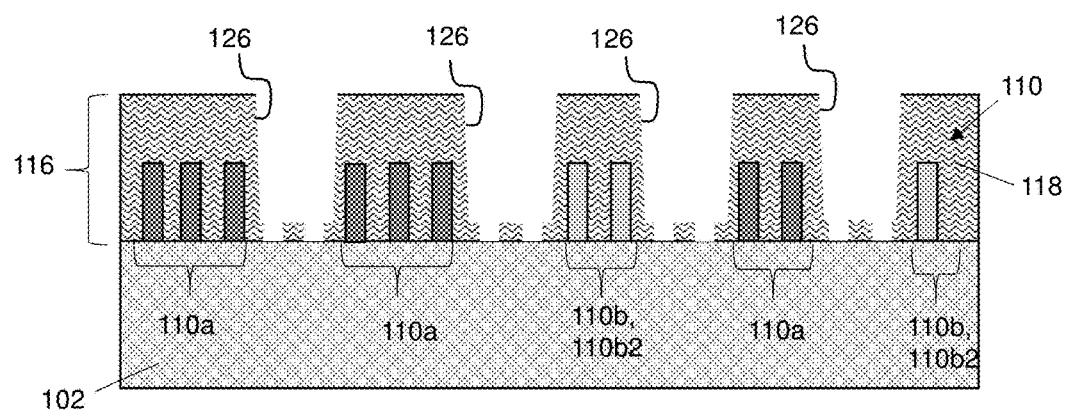
Figure 9:
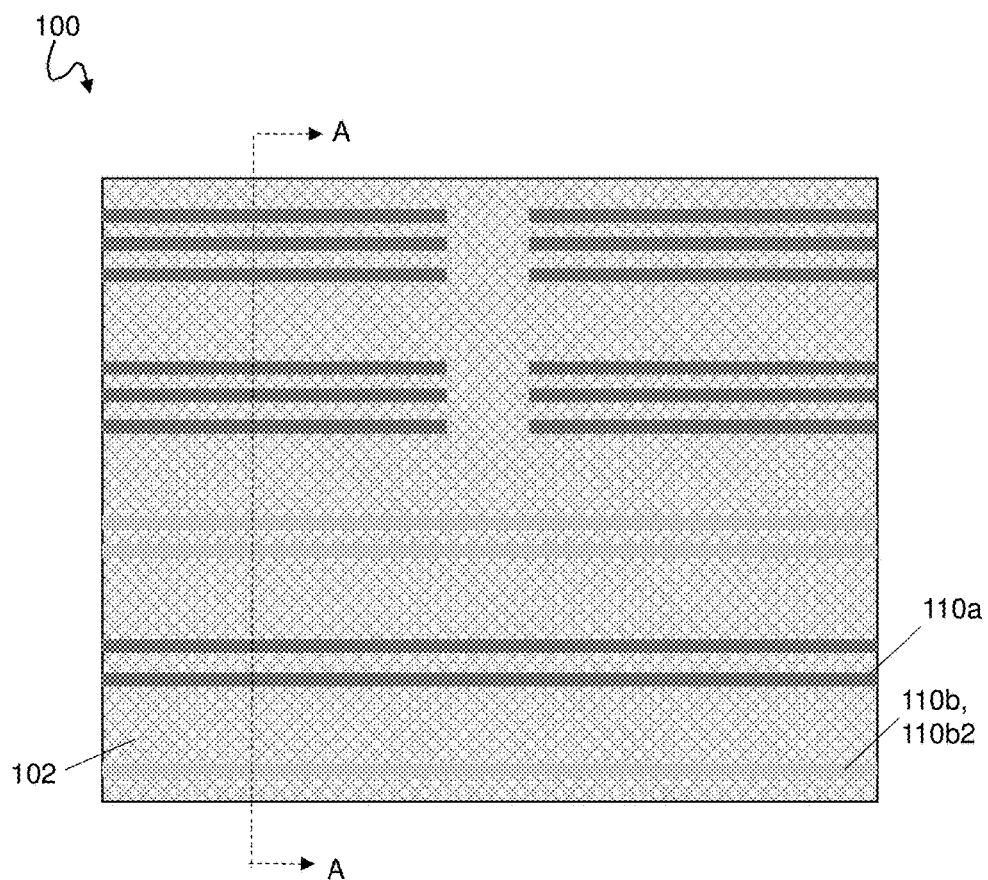
Figure 10:
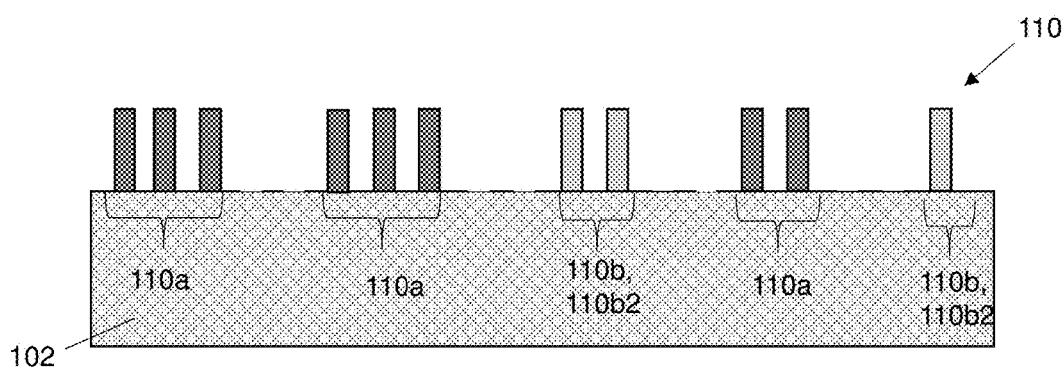
Figure 11:
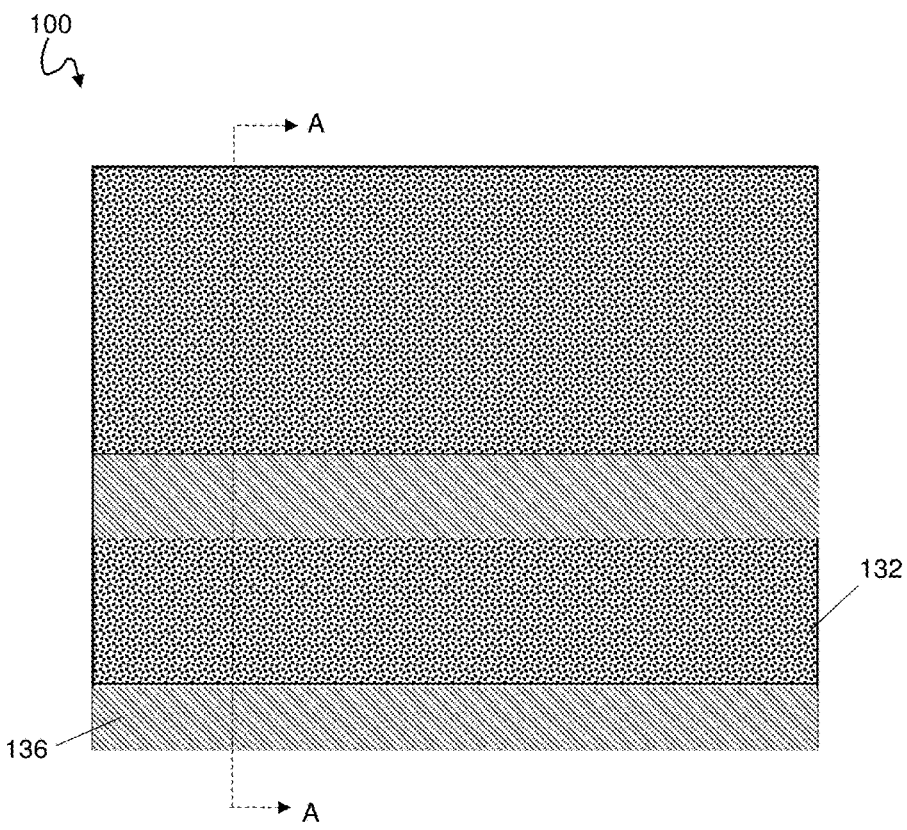
Figure 12:
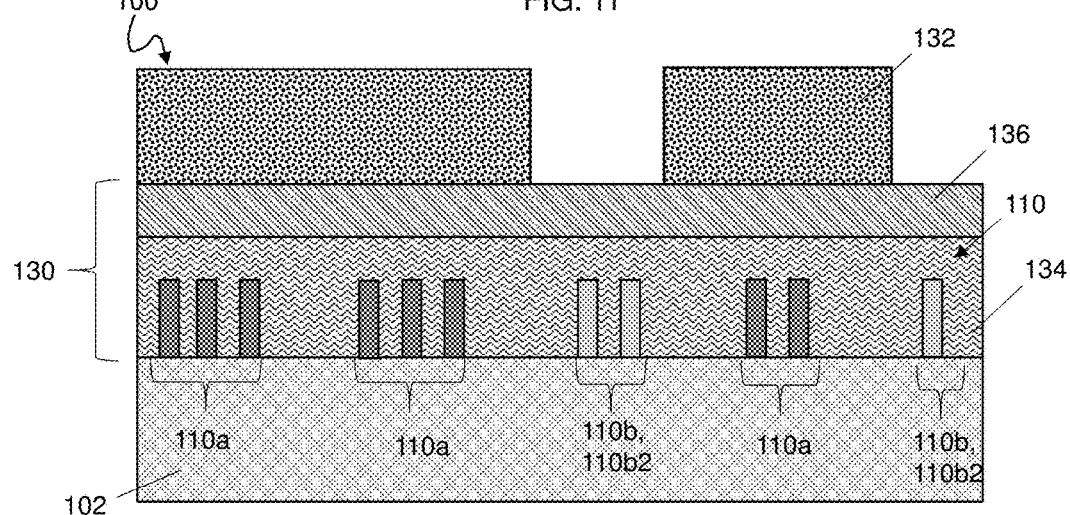

Turning now to FIGS. 7-8, the exposed first subset 110*b*1 of dummy nitride fins 110*b* may be removed from IC structure 100 to expose substrate 102 thereunder. That is, first subset 110*b*1 of dummy nitride fins 110*b* within a pre-defined distance of working nitride fins 110*a* may be removed. The exposed first subset 110*b*1 of dummy nitride fins 110*b* may be removed, e.g., by etching. As shown, portions of first mask 116, or more specifically, SiARC 122, may also be stripped or removed. During this removal, second subset 110*b*2 of dummy nitride fins 110*b* and working nitride fins 110*a* may remain covered by OPL 118 of mask 116. As shown in FIGS. 9-10, the remaining portions of first mask 116, i.e., OPL 118, may be stripped or removed to expose second subset 110*b*2 of dummy nitride fins 110*b* and working nitride fins 110*a* thereunder.

Turning now to FIGS. 11-14, a second lithography technique may be performed to expose and remove at least a portion of second subset 110*b*2 of dummy nitride fins 110*b* within a second mask 130. As shown, second subset 110*b*2 of dummy nitride fins 110*b* may include any remaining dummy nitride fins 110*b* that are beyond or outside the pre-defined distance from working nitride fins 110*a*. In instances where there is no nitride fins that are beyond the pre-defined distance, then there is no need to perform this second lithography technique. The second lithography technique may include using a conventional optical lithography that is less expensive than EUV lithography and can be performed using a krypton fluoride (KrF) scanner at a wavelength of about 248 nm. The conventional optical lithography technique can be used at this time because the pitch between second subset 110*b*2 of dummy nitride fins 110*b* and any working nitride fins 110*a* is larger and more variable than the pitch was between first subset 110*b*1 (FIGS. 5-6) of dummy nitride fins 110*b* and working nitride fins 110*a*. The conventional optical lithography technique can be used to remove second subset 110b2 of dummy fins 110b that are beyond the pre-defined distance from working nitride fins 110a since such removal does not require such high resolution. Therefore, the patterning need not be as accurate as was necessary during the first lithography technique. This second lithography technique can be used to remove remaining dummy nitride fins 110b that are not within the pre-defined distance from working nitride fins 110a from which active semiconductor fins are to be formed (the dark grey nitride fins). The second photolithography technique may include forming, e.g., depositing, second mask 130 over second subset 110b2 of dummy nitride fins 110b and working nitride fins 110a. Further, another photoresist 132 may be formed, e.g., deposited, over second mask 130. The second photolithography technique may also include patterning photoresist 132 to expose portions of second mask 130 thereunder which are disposed over second subset 110b2 of dummy nitride fins 110b. Photoresist 132 may employ, for example, a bright field optical reticle and PTD resist, or dark field optical reticle with NTD resist. Second mask 130 may include, for example, OPL 134 over second subset 110b2 of dummy nitride fins 110b, working nitride fins 110a, and substrate 102. Second mask 130 may also include SiARC 136 over OPL 134. More specifically, the patterning of photoresist 132 may expose portions of SiARC 136.

Figure 13:
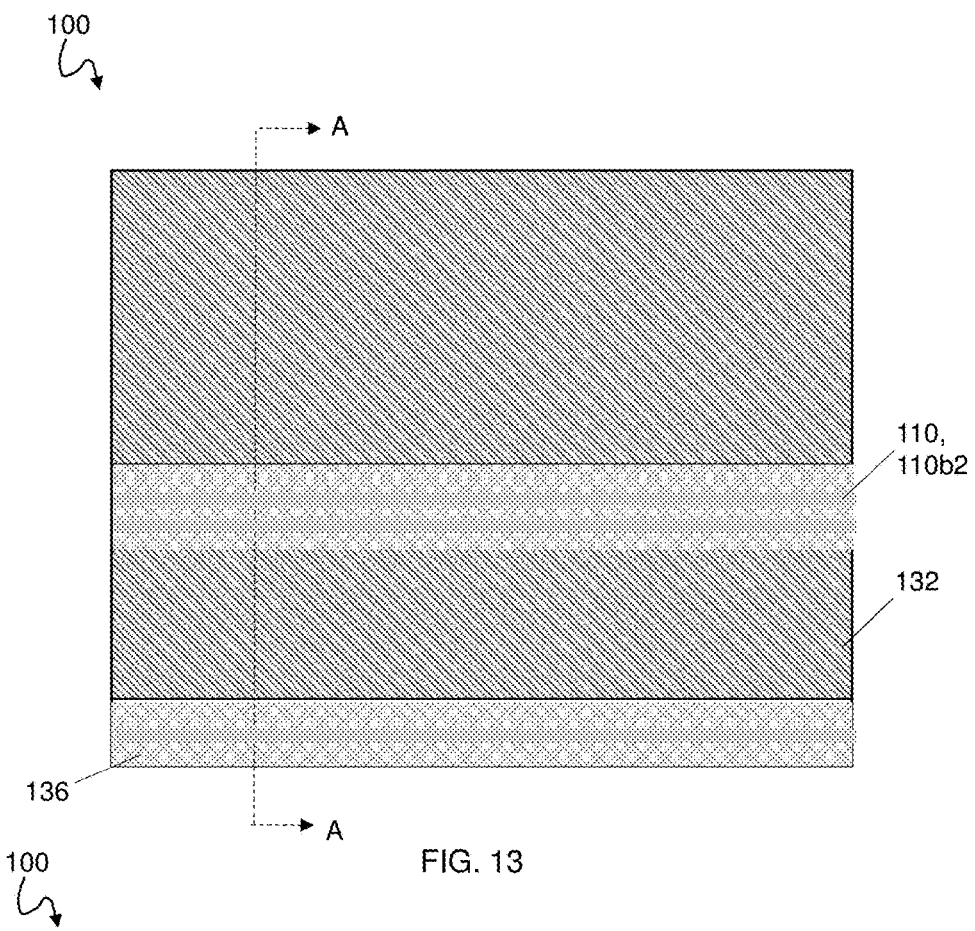
Figure 14:
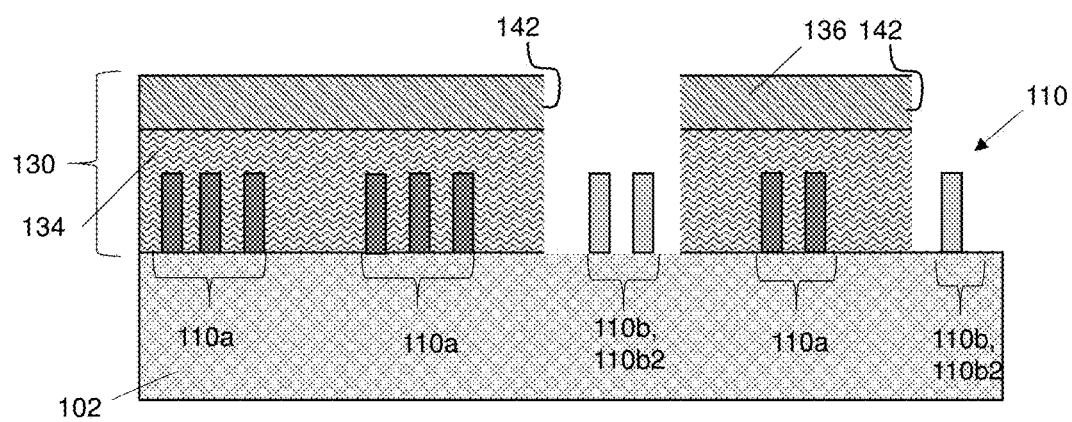

As shown in FIGS. 13-14, one or more openings 142 may be formed in the exposed portions of second mask 130 to expose second subset 110b2 of dummy nitride fins 110b. That is, an etch may be performed to transfer the pattern of the photoresist 132 (FIGS. 11-12) to the underlying OPL 134 and SiARC 136. In addition, photoresist 132 (FIGS. 11-12) may be stripped or removed to expose second mask 130 (or SiARC 136, more specifically) thereunder.

Figure 15:
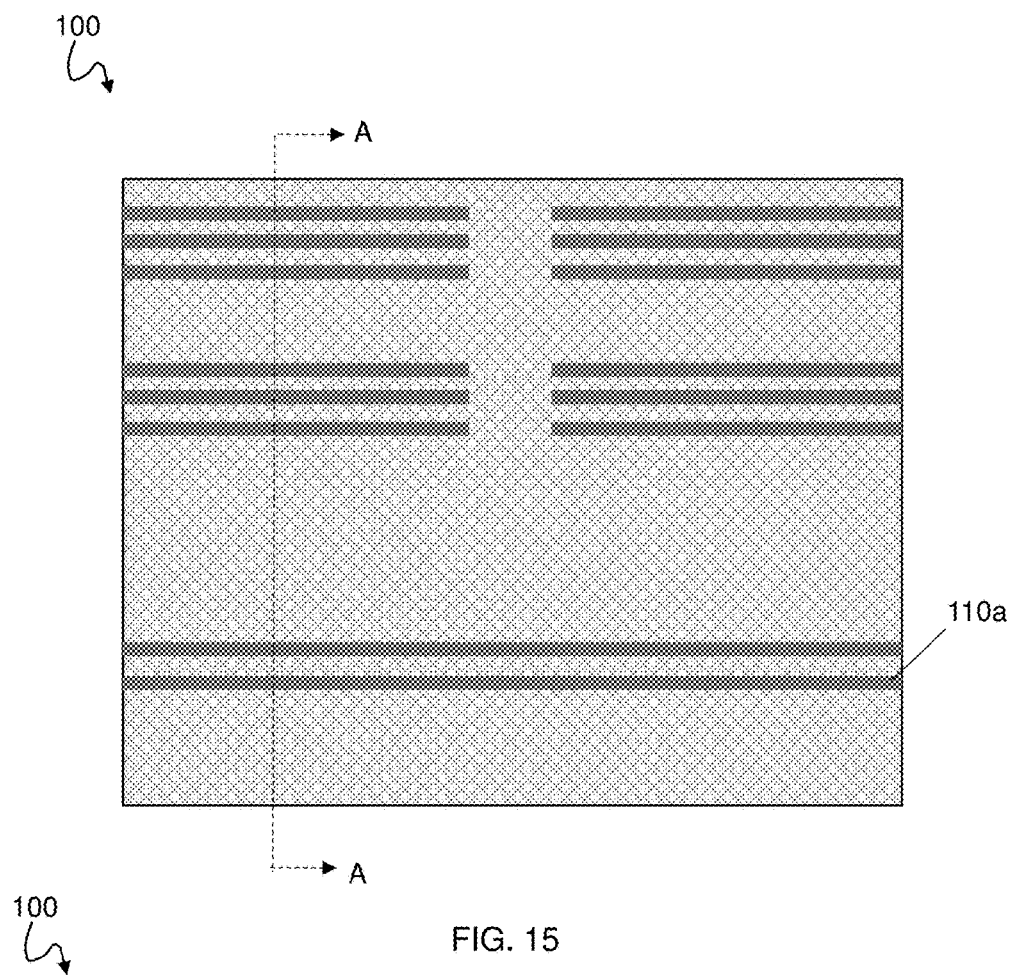
Figure 16:
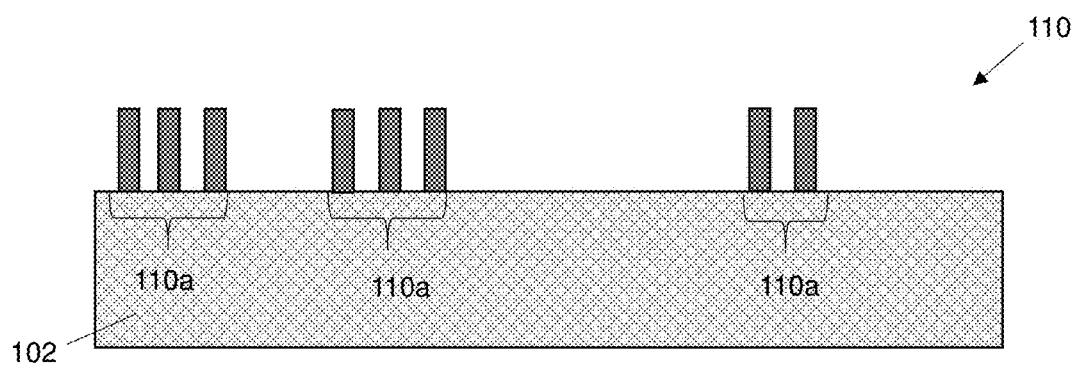

Turning now to FIGS. 15-16, an entirety of second subset 110b2 of dummy nitride fins 110b (FIGS. 13-14) may be removed, e.g., by etching, such that working nitride fins 110a remain on substrate 102. Portions of second mask 130 (FIGS. 13-14), or more specifically, SiARC 136 (FIGS. 13-14), may also be stripped or removed after removal of first subset 110b1. During this removal, working nitride fins 110a may remain covered by OPL 134 (FIGS. 13-14) of mask 130. Subsequently, the remaining portions of second mask 130, i.e., OPL 134, may be stripped or removed to expose working nitride fins 110a.

Figure 17:
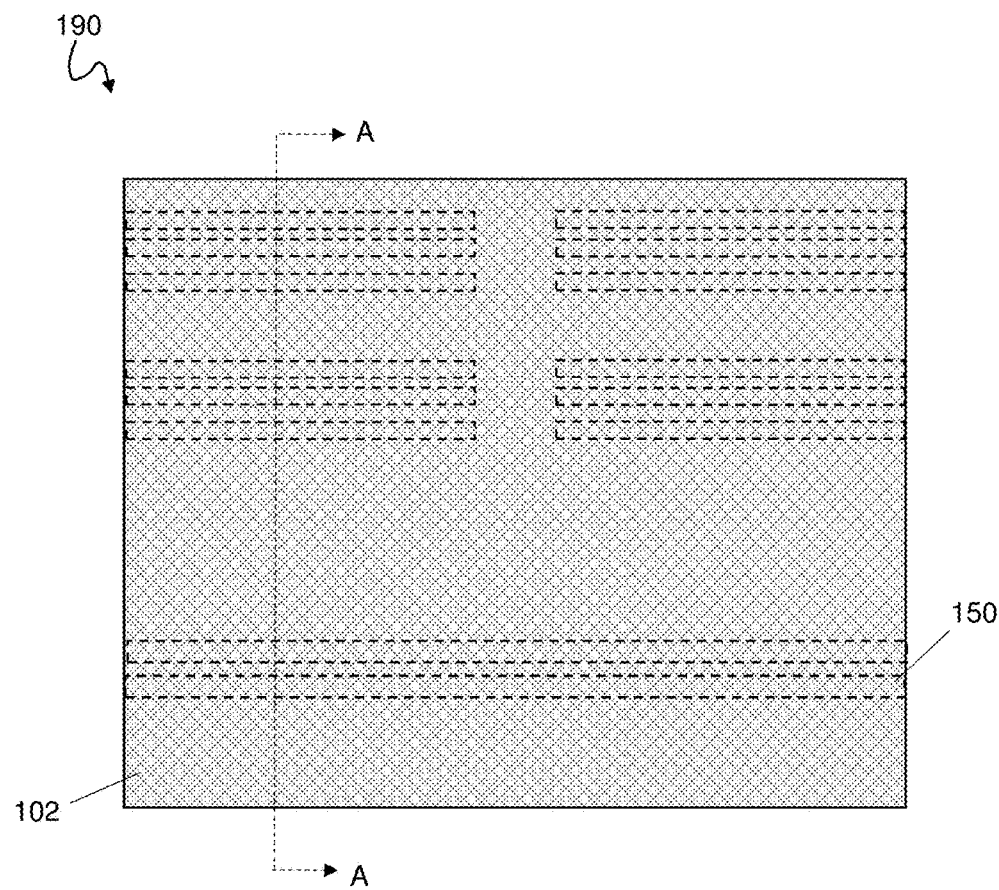
Figure 18:
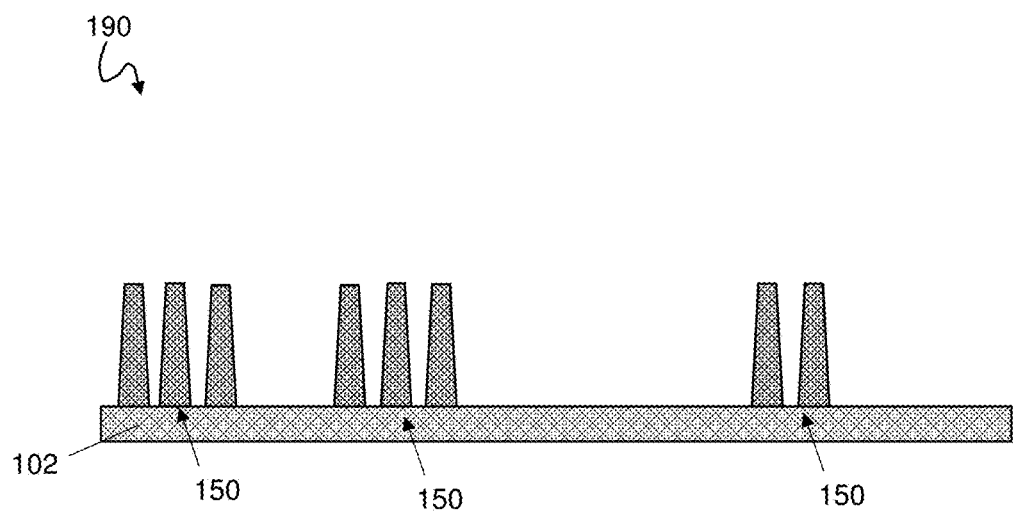

As shown in FIGS. 17-18, the method may continue with forming, e.g., by etching, a set of semiconductor fins 150 from substrate 102 using working nitride fins 110a as a mask. As shown, the resulting IC structure 190 may include substrate 102 and set of semiconductor fins 150 extending from substrate 102. While not shown herein, it is to be understood that the method described herein may continue with conventional complementary metal-oxide-semiconductor (CMOS) processing, e.g., forming gates, sources and drains, interconnects, dielectric layer, passivation layers, contacts/vias, etc.

In another embodiment of the disclosure, the first lithography technique may be a conventional optical lithography technique as described with respect to FIGS. 11-16 to expose the second subset 110b2 of dummy nitride fins 110b, i.e., dummy nitride fins 110b that are beyond the pre-defined distance of working nitride fins 110a, and the second lithography technique may be an EUV lithography technique as described with respect to FIGS. 3-10 to expose the first subset 110b1 of dummy nitride fins 110b, i.e., dummy nitride fins 110b that are within the pre-defined distance of working nitride fins 110a. That is, the order in which the performing of the EUV lithography technique and the conventional optical lithography technique may be reversed relative to one another such that dummy nitride fins 110b which are not within the pre-defined distance from working nitride fins 110a are removed first by the conventional optical lithography technique, and dummy nitride fins 110b which are within the pre-defined distance from working nitride fins 110a are removed second by the EUV lithography technique.

Figure 19:
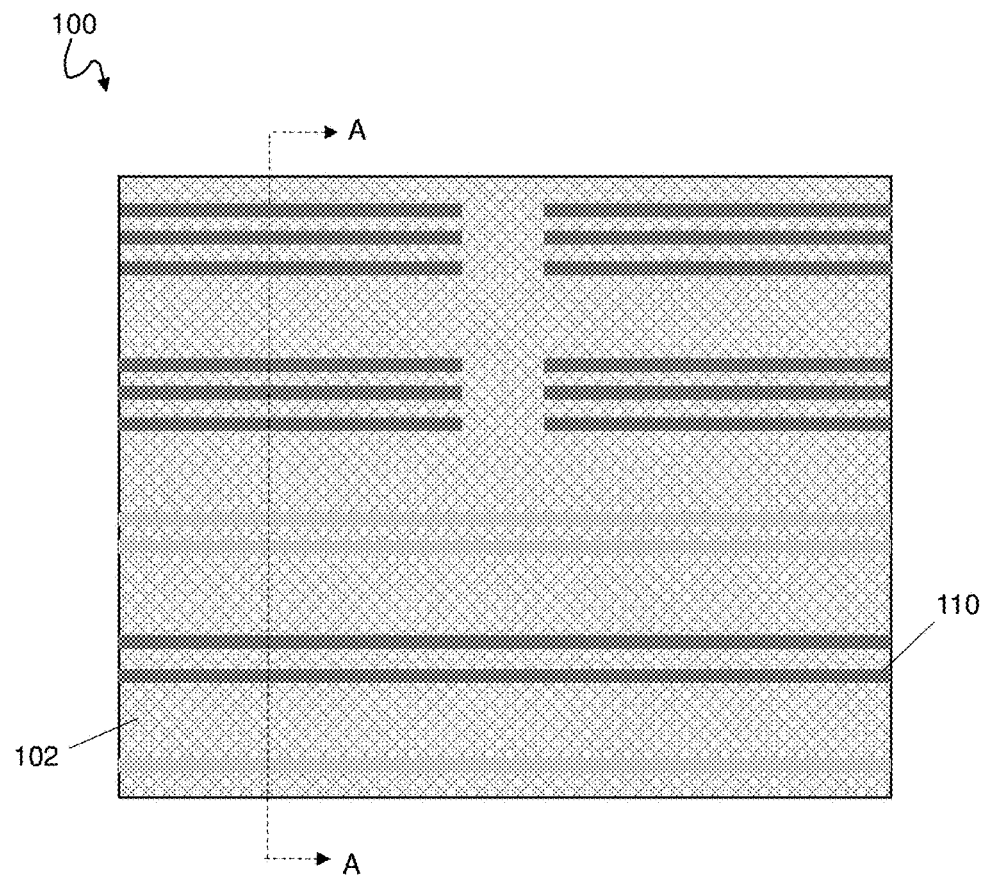
FIGS. 19-30 show an integrated circuit structure undergoing a method according another aspect of the disclosure wherein the odd numbered figures (e.g., FIGS. 19, 21, 23 . . . 29) show a top-down view of the integrated circuit structure and the even numbered figures (e.g., FIGS. 20, 22, 24 . . . 30) show a cross-sectional view of the integrated circuit structure taken along line A-A of the odd numbered figures.
Figure 20:
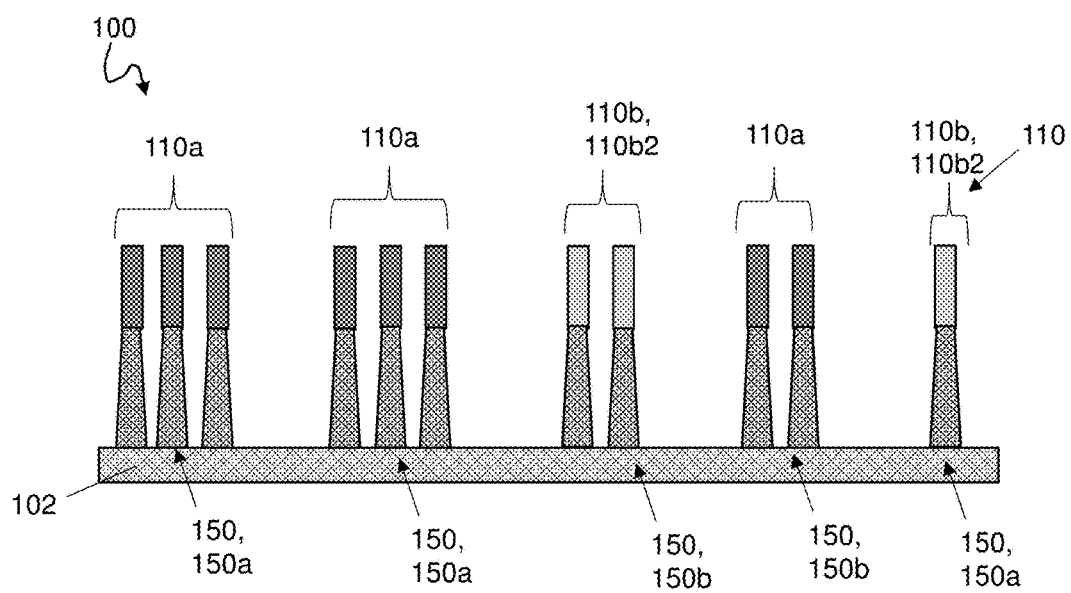

FIGS. 19-30 show another embodiment of the disclosure. In this embodiment, the second subset dummy nitride fins 110b2, together with dummy semiconductor fins formed thereby, may be removed after semiconductor fins are formed. More specifically, after the processes discussed with respect to FIGS. 9-10 are performed, second subset 110b2 of dummy nitride fins 110b and working nitride fins 110a may be used as a mask to form, e.g., by etching, semiconductor fins 150 (a set of semiconductor fins) from substrate 102 as shown in FIGS. 19-20. As shown, set of semiconductor fins 150 may include active semiconductor fins 150a and dummy semiconductor fins 150b. Active semiconductor fins 150a may be desired to remain within IC structure 100 and may be defined by working nitride fins 110a. Dummy semiconductor fins 150b may be desired to be removed from IC structure 100 and may be defined by second subset 110b2 dummy nitride fins 110b.

Figure 21:
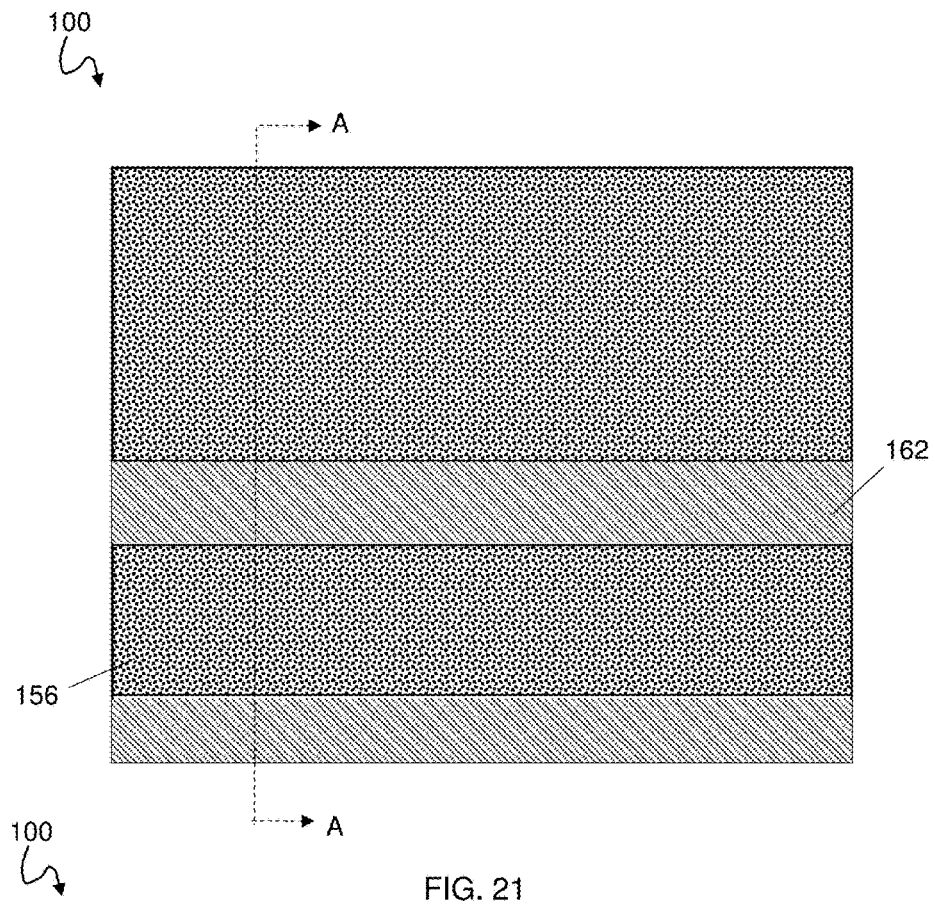
Figure 22:
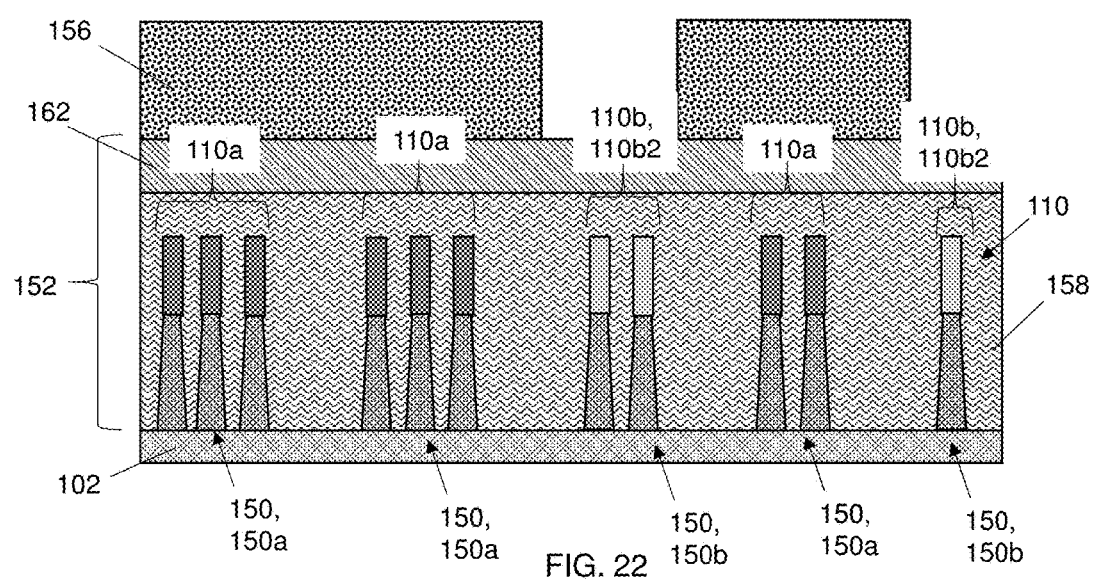
Figure 23:
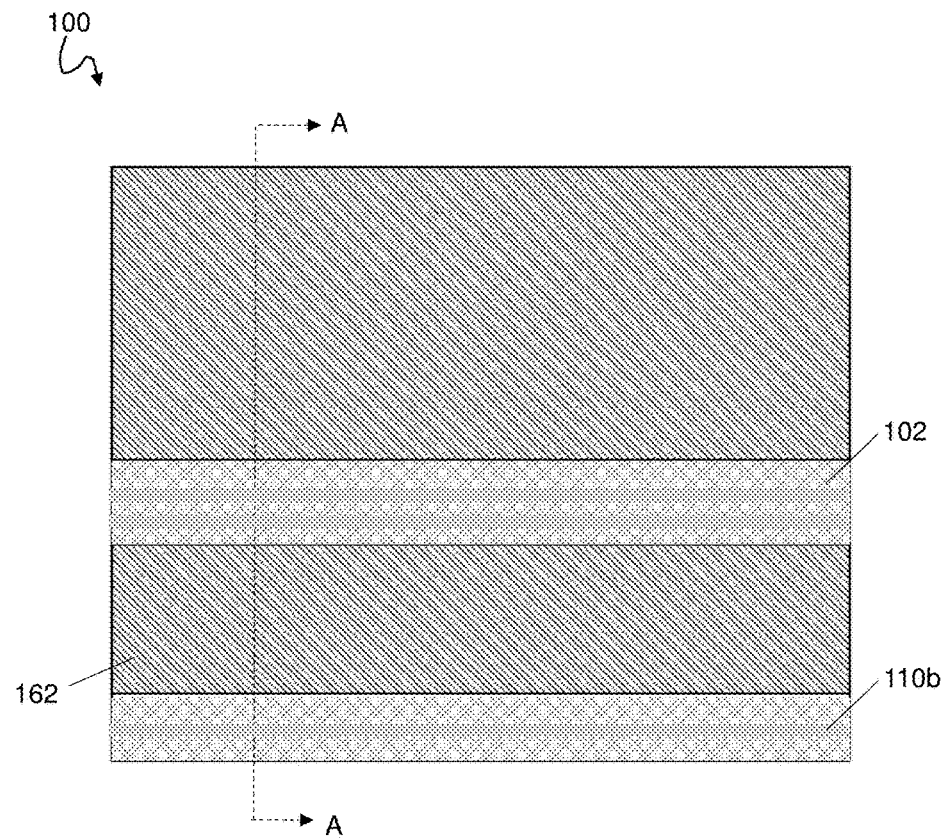
Figure 24:
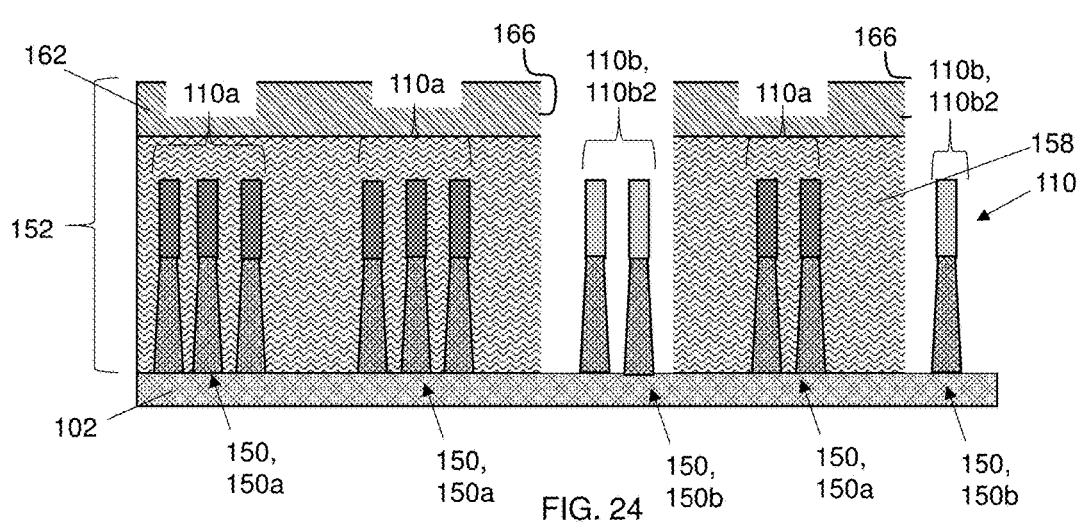

Turning to FIGS. 21-22, a second lithography technique may be used to expose and remove dummy semiconductor fins 150b (together with second subset 110b2 of dummy nitride fins 110b thereover) within another mask 152. More specifically, second lithography technique may be used to remove dummy semiconductor fins 150b that are formed by dummy nitride fins 110b outside of pre-defined distance from working nitride fins 110a or active semiconductor fins 150a. The second lithography technique may include using a less expensive block mask (a conventional optical lithography technique) formed over the set of semiconductor fins 150 similar to that described with respect to FIGS. 11-14. More specifically, performing the second lithography technique may include forming, e.g., depositing, mask 152 over set of semiconductor fins 150. Further, another photoresist 156 may be formed, e.g., deposited, over mask 152. Photoresist 156 may include a bight field reticle with PTD resist, or a dark field reticle with NTD resist. Mask 152 may include OPL 158 and SiARC 162. Further, photoresist 156 may be patterned to expose portions of mask 152 thereunder, which are disposed over dummy semiconductor fins 150b. As shown, semiconductor fins 150 each include nitride fins 110 thereover. Additionally, performing the second lithography technique may include forming an opening 166 in the exposed portions of mask 152 to expose dummy semiconductor fins 150b and portions of substrate 102 as shown in FIGS. 23-24. That is, an etch may be performed to transfer the pattern of the photoresist 156 to the underlying OPL 158 and SiARC 162. In addition, photoresist 156 (FIGS. 21-22) may be stripped or removed to expose second mask 152 (or SiARC 162, more specifically) thereunder. Active semiconductor fins 150a may remain covered by mask 152.

Figure 25:
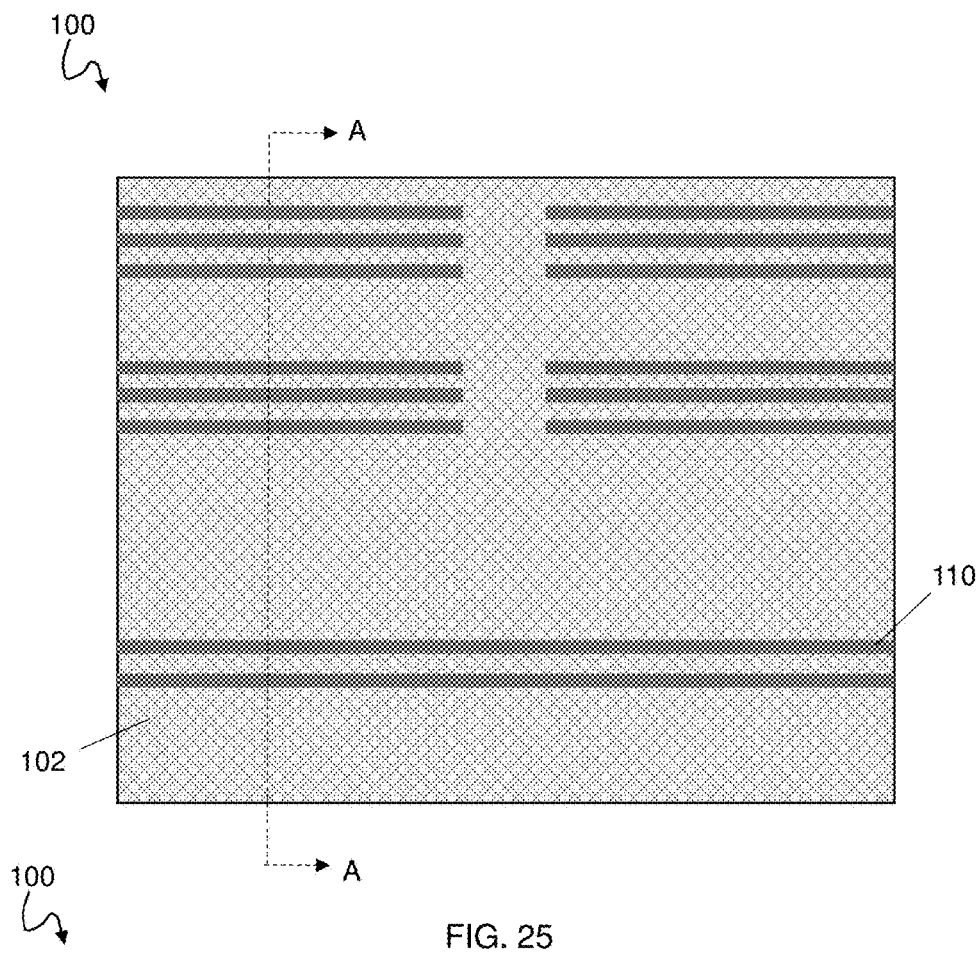
Figure 26:
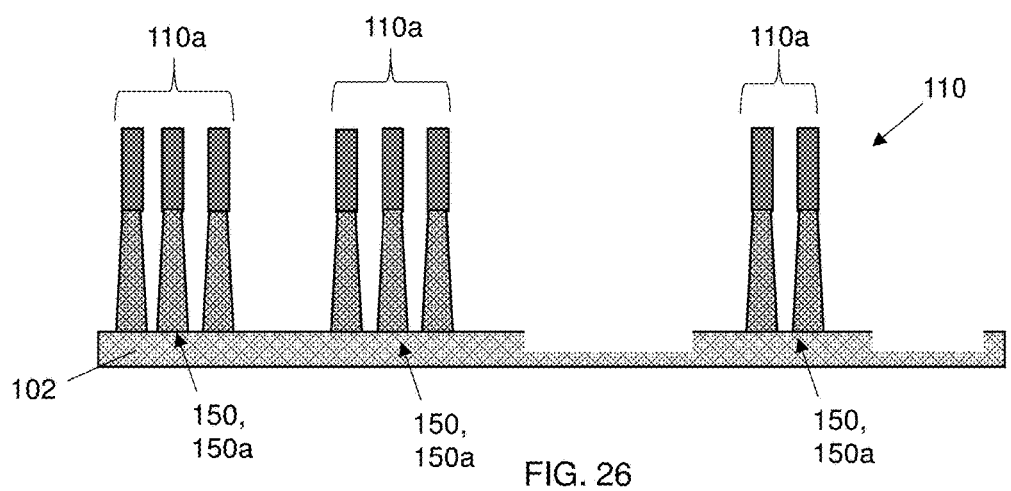

As shown in FIGS. 25-26, the method may continue with removing dummy semiconductor fins 150b having dummy nitride fins 110b thereover (FIGS. 23-24) such that active semiconductor fins 150a remain beneath mask 152 (FIGS. 23-24). After dummy semiconductor fins 150b are removed, mask 152 may be removed to expose active semiconductor fins 150a having working nitride fins 110a thereover such that active semiconductor fins 150a remain on substrate 102 as described herein relative to FIGS. 13-16.

Figure 27:
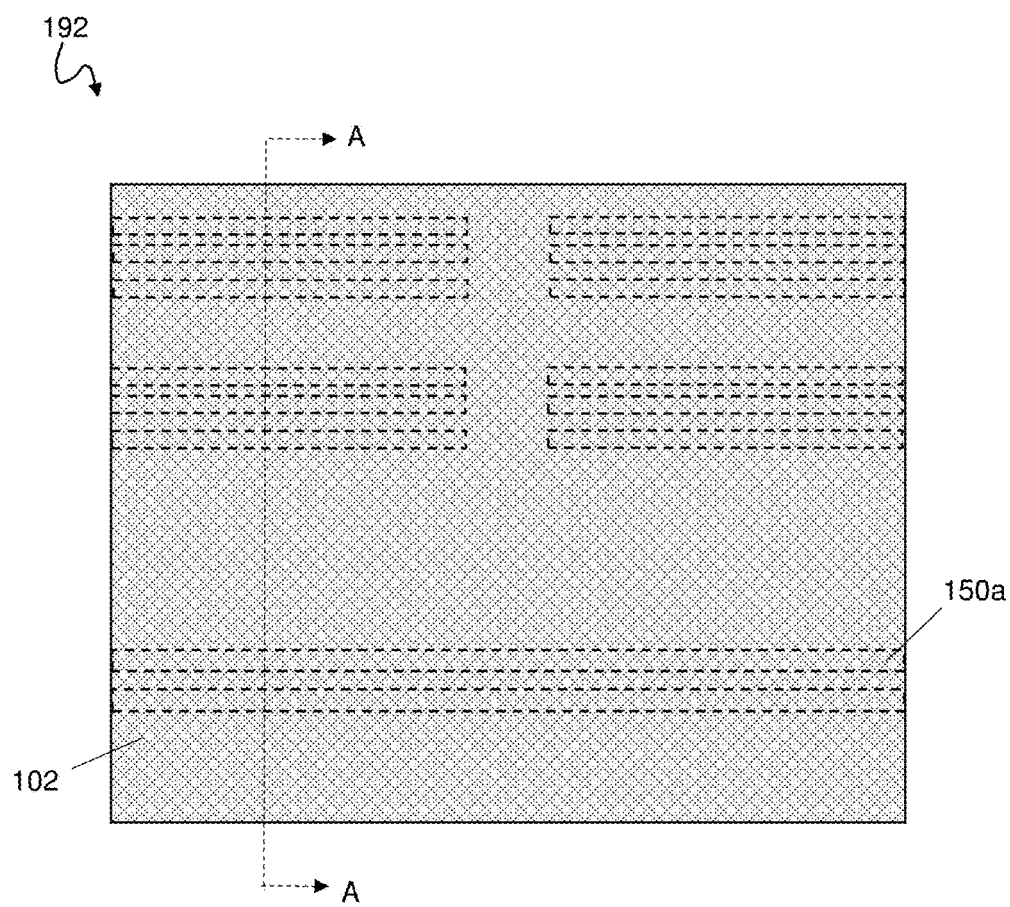
Figure 28:
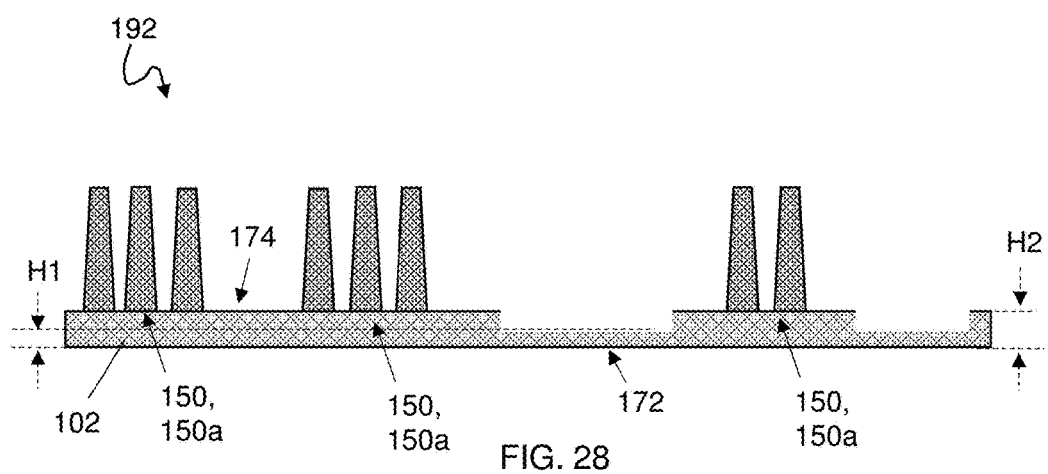
Figure 29:
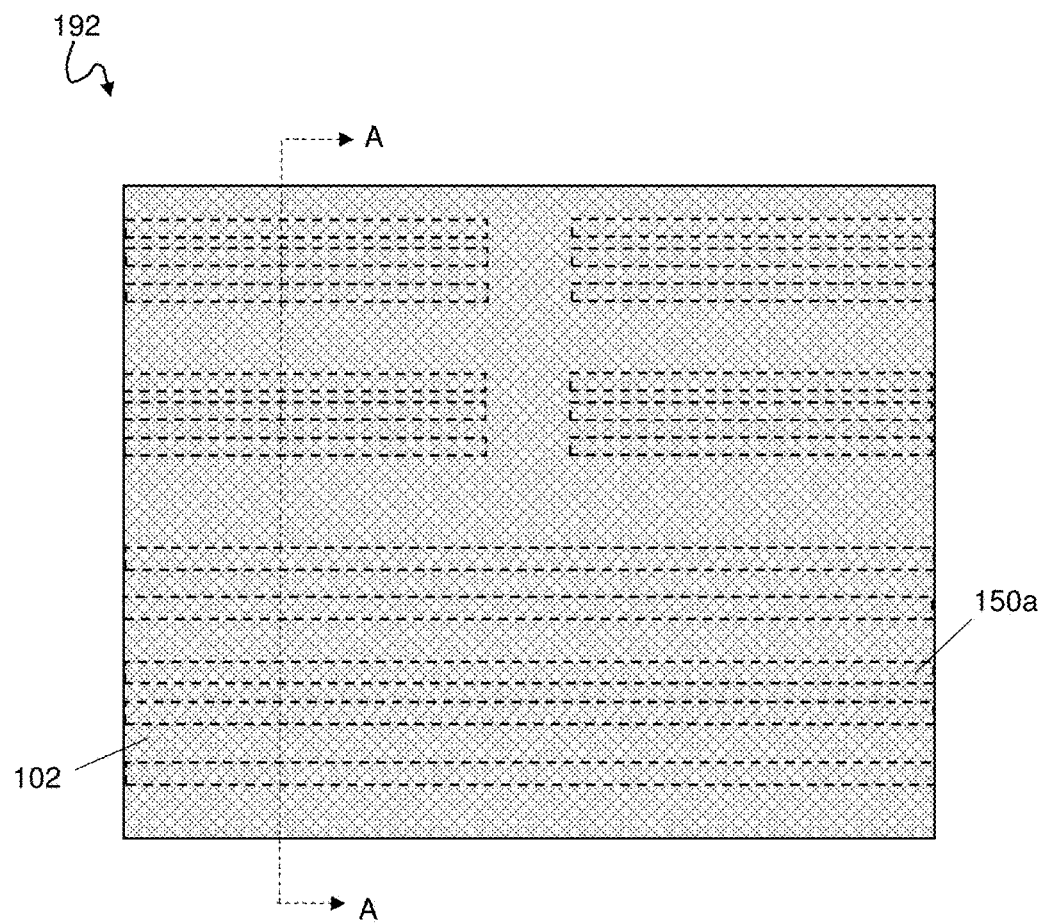
Figure 30:
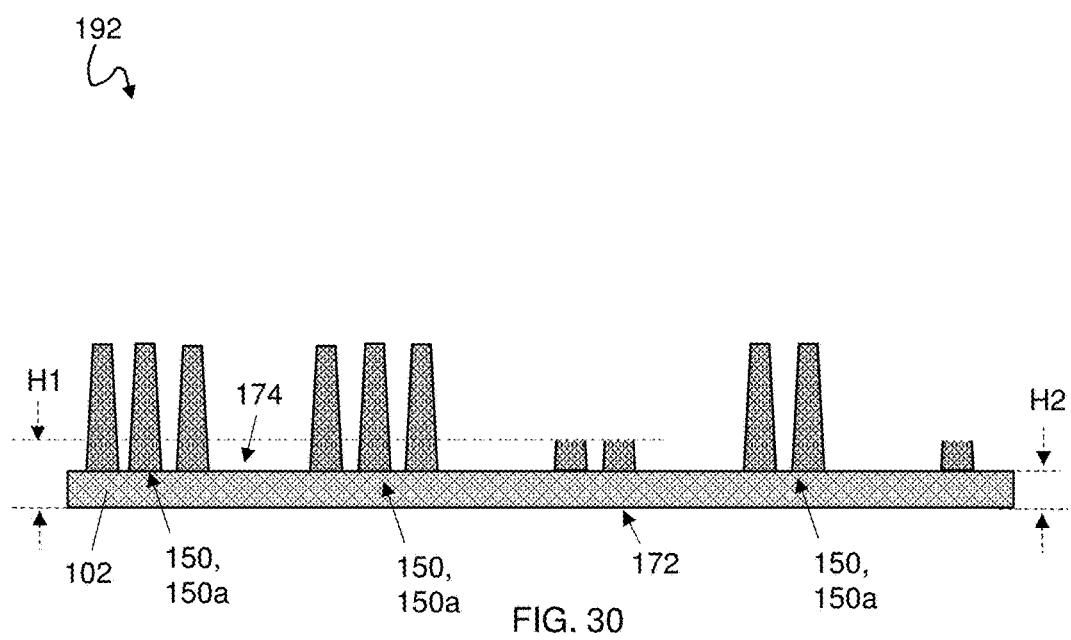

Referring now to FIGS. 27-28, working nitride fins 110a may each be removed from over each of active semiconductor fins 150a such that active semiconductor fins 150a are exposed and remain on substrate 102. As shown, the resulting IC structure 192 may include substrate 102 including a first location 172 having a first height H1 and a second, distinct location 174 having a second height H2; and set of active semiconductor fins 150a extending from substrate 102, wherein first location 172 of substrate 102 is devoid of semiconductor fins 150a and second location 174 of substrate 102 is disposed between adjacent active semiconductor fins 150a. In one embodiment, as shown in FIGS. 27-28, first height H1 is less than second height H2 which may be due to over-etching to remove dummy semiconductor fins 150b. That is, the removing of dummy semiconductor fins 150b may include removing dummy semiconductor fins 150b such that first height H1 of substrate 102 at first location 172 where dummy semiconductor fins 150b are removed is less than second height H2 of substrate 102 at second location 174 between adjacent fins of active semiconductor fins 150a. In another embodiment, as shown in FIGS. 29-30, first height H1 is greater than second height H2 which may be due to under-etching to remove dummy semiconductor fins 150b. That is, the removing of dummy semiconductor fins 150b may include removing dummy semiconductor fins 150b such that first height H1 of substrate 102 at first location 172 where dummy semiconductor fins 150b are removed is greater than second height H2 of substrate 102 at second location 174 between adjacent fins of the active semiconductor fins 150a. While not shown herein, it is to be understood that the method described herein may continue with conventional complementary metal-oxide-semiconductor (CMOS) processing, e.g., forming gates, sources and drains, interconnects, dielectric layer, passivation layers, contacts/vias, etc. Further, it is to be understood that the order of the EUV lithography technique and the conventional optical lithography technique may be reversed relative to one another such that dummy nitride fins 110b which are not within the pre-defined distance from working nitride fins 110a are removed first during by the conventional optical lithography technique, and dummy semiconductor fins 150b which are within the pre-defined distance from working nitride fins 110a or active semiconductor fins 150a are removed second during the EUV lithography technique.

In another embodiment, only an EUV lithography technique may be performed. In such an embodiment, a conventional lithography technique employing, e.g., the cheap block mask, does not need to follow or precede the EUV lithography technique, and may not be performed. According to this embodiment, after the fin etching process, there may be one or more dummy semiconductor fins remaining on the IC structure, which may be properly cut or disconnected such that their existence does not affect the device formation process using other active semiconductor fins and/or performance of other active semiconductor fins. This embodiment will be discussed relative to FIGS. 31-36.

Figure 31:
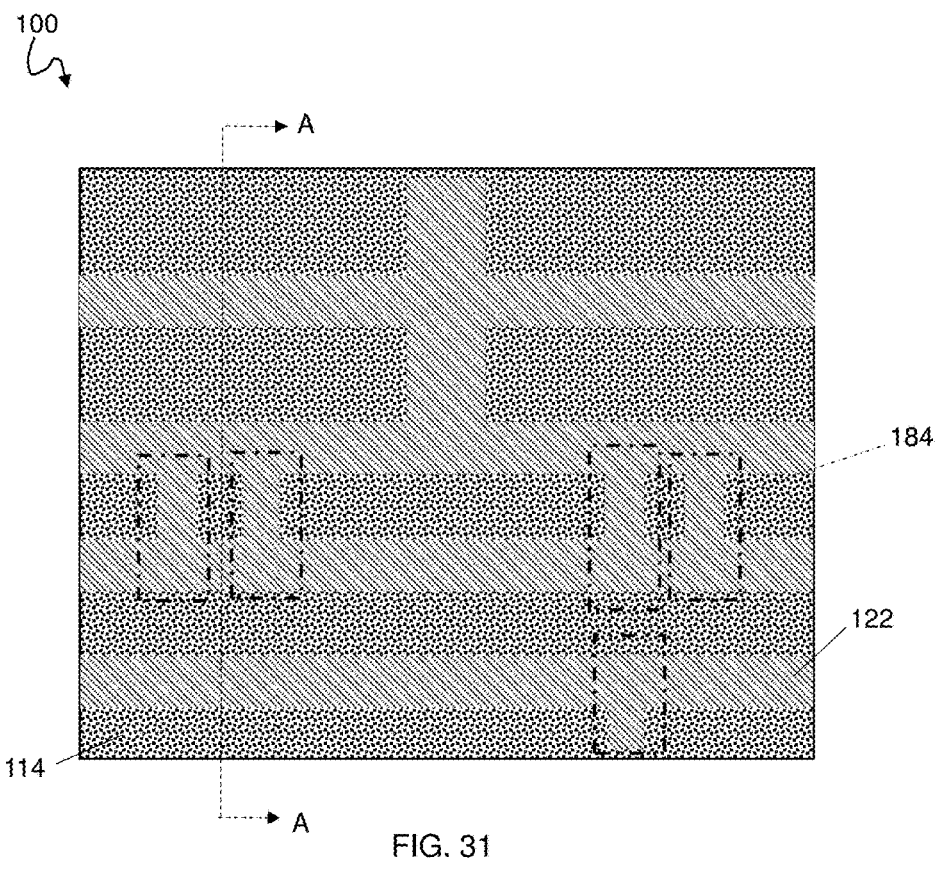
FIGS. 31-36 show an integrated circuit structure undergoing a method according another aspect of the disclosure wherein the odd numbered figures (e.g., FIGS. 31, 33, and 35) show a top-down view of the integrated circuit structure and the even numbered figures (e.g., FIGS. 32, 34, and 36) show a cross-sectional view of the integrated circuit structure taken along line A-A of the odd numbered figures.
Figure 32:
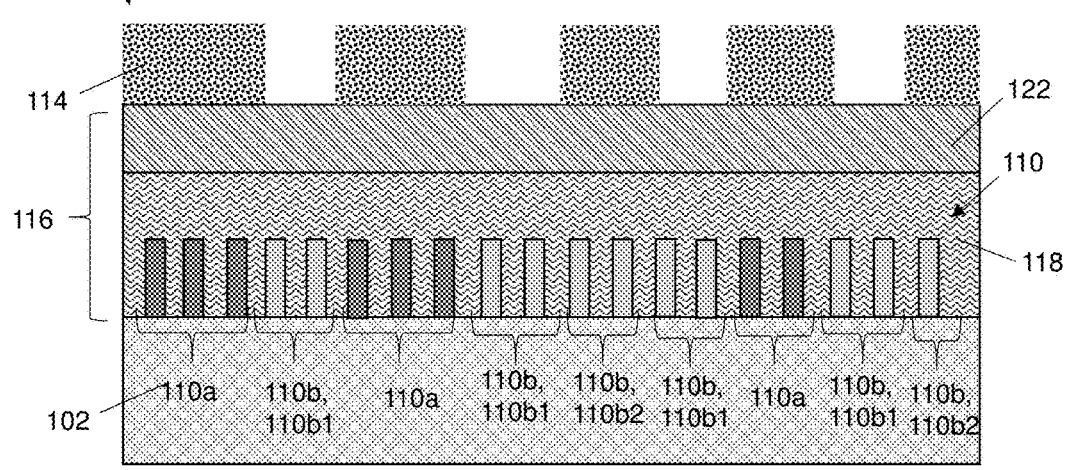

Turning first to FIGS. 31-32, the performing of the EUV lithography technique may be substantially similar to that described relative to FIGS. 3-10. However, in this embodiment, the EUV lithography technique which is used to expose (and subsequently remove) the first subset of dummy nitride fins 110b1 may also be used to expose simultaneously (and subsequently disconnect or cut) certain portions of dummy nitride fins 110b2. This creates spaces for the formation of a gate or gates (as will be described with respect to FIGS. 35-36) such that the gate or gates may be able to avoid contacting these remaining portions of dummy semiconductor fins as will be described herein. That is, the same EUV lithography technique may be used to both expose (and subsequently remove) the first subset of dummy nitride fins 110b1 and to expose simultaneously (and subsequently disconnect or cut) certain portions of dummy nitride fins 110b2. More specifically, photoresist 114 may be patterned to expose mask 116 in areas, e.g., areas 184, where it is desired to remove portions of second subset 110b2 of dummy nitride fins 110b in addition to exposing mask 116 that is disposed over first subset 110b1 of dummy nitride fins 110b. After photoresist 114 is patterned, the EUV lithography technique will continue as described relative to FIGS. 5-10. However, in this embodiment, the portions of second subset 110b2 of dummy nitride fins 110b in areas 184 may also be removed during the EUV lithography technique. Subsequently, working nitride fins 110a and remaining portions of second subset 110b2 of dummy nitride fins 110b may be used as a mask to form, e.g., by etching, semiconductor fins 150 from substrate 102 as described relative to FIGS. 19-20. It should be understood, that the EUV lithography technique may be customized based on the connections that are desired to be formed. It should be also understood that areas 184 are limited to the positions shown herein and may be designated to be elsewhere within IC structure 100 without departing from aspects of the disclosure.

Figure 33:
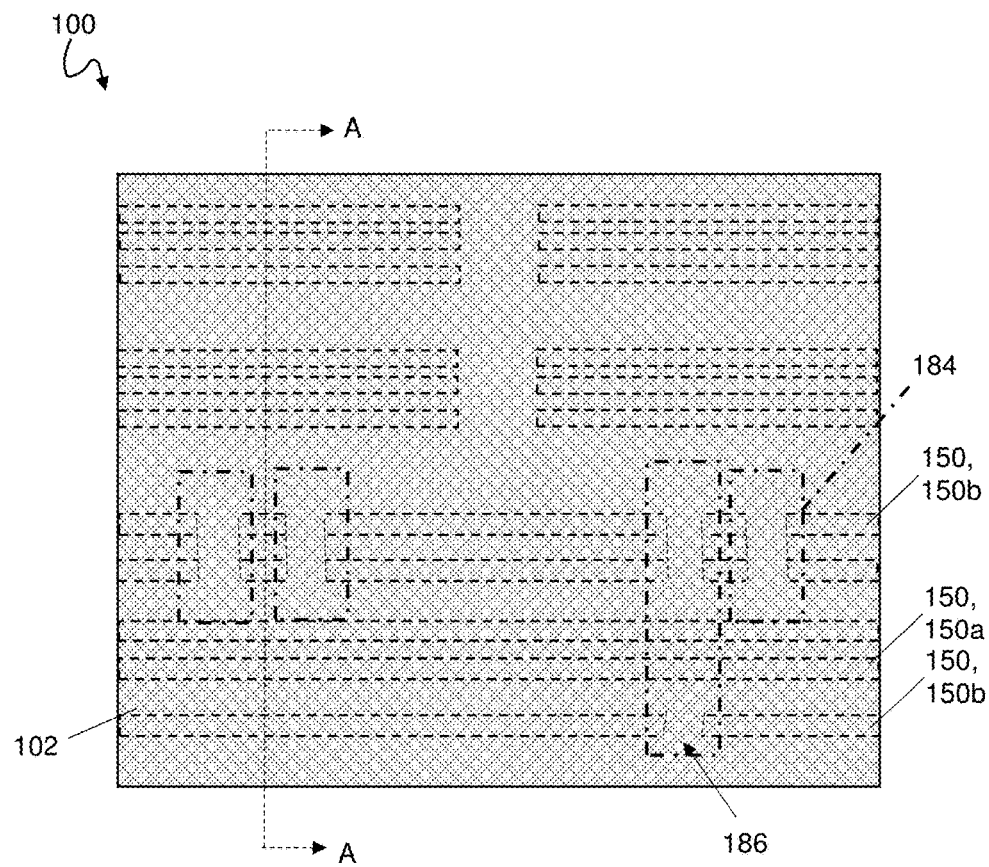
Figure 34:
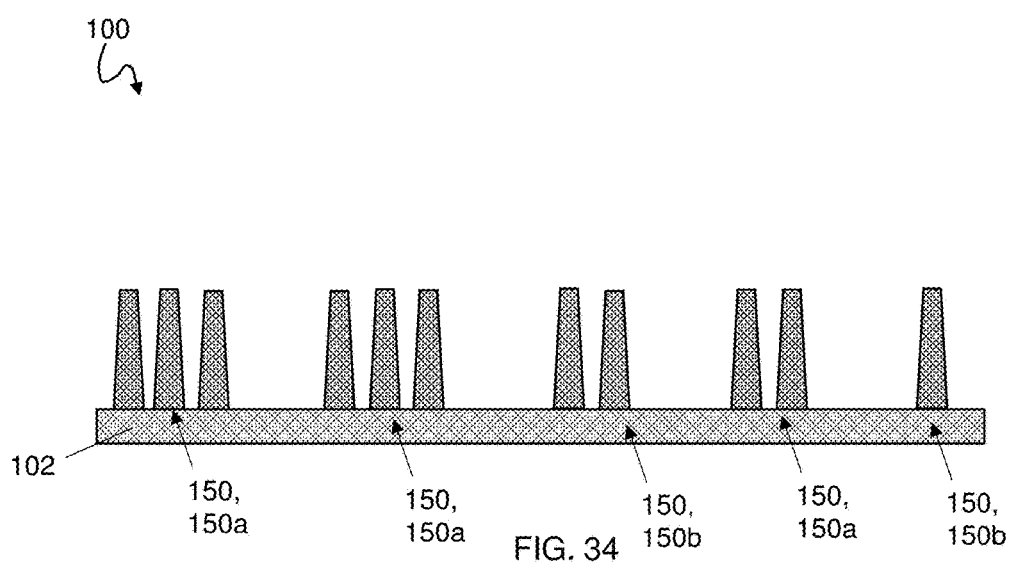

Turning now to FIGS. 33-34, after semiconductor fins 150 are formed, second subset 110b2 of dummy nitride fins 110 and working nitride fins 110a may be removed to expose semiconductor fins 150 thereunder as shown in FIGS. 33-34. That is, instead of performing the second lithography technique to remove dummy semiconductor fins 150 as described relative to FIGS. 21-26, second subset 110b2 of dummy nitride fins 110 and working nitride fins 110a may be removed to expose semiconductor fins 150 thereunder. As a result, both active semiconductor fins 110a and portions of dummy semiconductor fins 110b remain on substrate 102. However, due to the patterning of photoresist 114 (FIGS. 31-32) portions of dummy semiconductor fins 150b are removed thereby forming disconnects 186 in areas 184.

Figure 35:
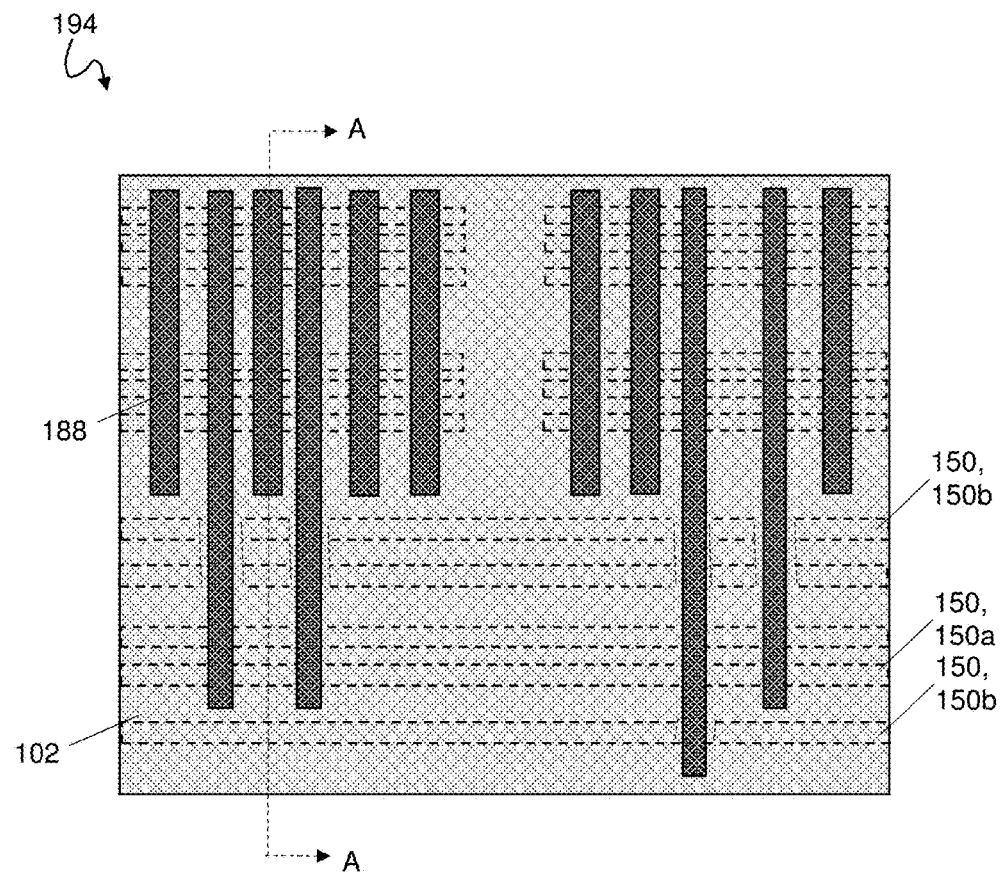
Figure 36:
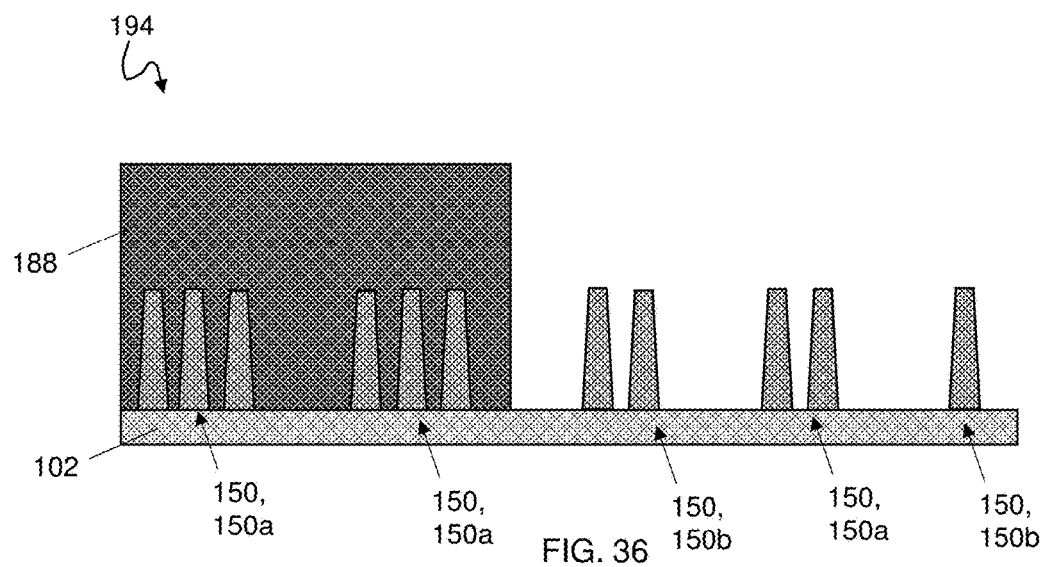

As shown in FIGS. 35-36, one or more gates 188 may be formed perpendicular to and over active semiconductor fins 150a to form resulting IC structure 194. Gates 188 may be formed using conventional gate fabrication techniques, e.g., depositing, patterning, etching, etc., and may include conventional gate stack materials, e.g., spacers, gate dielectric, gate conductor, etc. As shown, gates 188 do not contact remaining dummy semiconductor fins 150b because portions of dummy semiconductor fins 150 where gates 188 are to be formed were removed during the EUV lithography technique. Therefore, gates 188 contact active semiconductor fins 150a. It is to be understood that the formation of gates 188 may be customized and is not limited to the orientation shown in FIGS. 35-36. Additionally, while not shown herein, it is to be understood that the method described herein may continue with conventional complementary metal-oxide-semiconductor (CMOS) processing, e.g., sources and drains, interconnects, dielectric layer, passivation layers, contacts/vias, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the disclosure.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit structure, the method comprising:
   providing a set of fins over a semiconductor substrate, the set of fins including a plurality of working fins and a plurality of dummy fins, the plurality of dummy fins including a first subset of dummy fins within a pre-defined distance from any of the plurality of working fins, and a second subset of dummy fins beyond the pre-defined distance from any of the plurality of working fins;
   removing the first subset of dummy fins by an extreme ultraviolet (EUV) lithography technique; and
   removing at least a portion of the second subset of dummy fins.

2. The method of claim 1, wherein the EUV lithography technique employs a dark field reticle with a positive tone development (PTD) photoresist, the dark field reticle determines the pre-defined distance.

3. The method of claim 1, wherein the at least a portion of the second subset of dummy fins is removed by the EUV lithography technique at the same time that removes the first subset of dummy fins.

4. The method of claim 1, wherein removing the at least a portion of the second subset of dummy fins comprises removing the entire second subset of dummy fins by a lithography technique employing a block mask.

5. The method of claim 1, wherein the plurality of working fins include working nitride fins, and further comprising:
   using the working nitride fins to form active semiconductor fins.

6. The method of claim 2, wherein the pre-defined distance is less than approximately 80 nanometers (nm).

7. The method of claim 2, wherein the EUV lithography technique includes:
   patterning the PTD photoresist to expose portions of a mask under the PTD photoresist; and
   forming an opening in the exposed portions of the mask to expose the first subset of dummy fins, wherein the plurality of working fins and the second subset of dummy fins remain covered by the mask.

8. The method of claim 4, wherein the lithography technique employing the block mask includes:
   forming the block mask over the second subset of dummy fins and the plurality of working fins;
   patterning a photoresist to expose portions of the block mask thereunder which are disposed over the second subset of dummy fins; and
   forming an opening in the exposed portions of the block mask to expose the second subset of dummy fins, wherein the working fins remain covered by the block mask.

9. The method of claim 8, further comprising:
   after the forming of the opening in the exposed portions of the block mask, removing the photoresist from over the block mask and removing of the block mask.

10. A method of forming an integrated circuit structure, the method comprising:
    providing a set of nitride fins over a semiconductor substrate, the set of nitride fins including a plurality of working nitride fins and a plurality of dummy nitride fins;
    performing an extreme ultraviolet (EUV) lithography technique to remove a first subset of the plurality of dummy nitride fins from over the semiconductor substrate such that a second subset of the plurality of dummy nitride fins and the plurality of working nitride fins remain, wherein the first subset of the plurality of dummy nitride fins is within a pre-defined distance from any of the plurality of working nitride fins and the second subset of the plurality of dummy nitride fins is beyond the pre-defined distance from any of the plurality of working nitride fins; and forming a set of dummy semiconductor fins from the second subset of the plurality of dummy nitride fins and forming a set of active semiconductor fins from the plurality of working nitride fins.

11. The method of claim 10, wherein the pre-defined distance is determined by the EUV lithography technique.

12. The method of claim 10, wherein the EUV lithography technique employs positive tone development (PTD) photoresist and a dark field reticle, the dark field reticle determining the pre-defined distance.

13. The method of claim 10, further comprising:

performing a lithography technique employing a block mask to remove the set of dummy semiconductor fins such that the set of active semiconductor fins remains on the semiconductor substrate.

14. The method of claim 10, wherein the performing of the EUV lithography technique further includes removing a portion of certain dummy nitride fins in the second subset of the plurality of dummy nitride fins to create disconnects within the second subset of the plurality of dummy nitride fins for forming a functional structure for the subsequently formed active semiconductor fins.

15. The method of claim 12, wherein the pre-defined distance is less than approximately 80 nanometers (nm).

16. The method of claim 13, wherein the performing of the lithography technique employing the block mask includes removing the set of dummy semiconductor fins such that a first height of the semiconductor substrate at a first location where the set of dummy semiconductor fins are removed is distinct from a second height of the semiconductor substrate at a second location between adjacent fins of the set of active semiconductor fins.

17. The method of claim 13, wherein the functional structure includes a gate, and further comprising:

forming the gate perpendicular to the set of active semiconductor fins, wherein the gate does not contact the set of dummy semiconductor fins.

18. An integrated circuit structure comprising:

a substrate including a first location having a first height and a second, distinct location having a second height; and a set of semiconductor fins extending directly from the substrate, wherein the first location of the substrate is devoid of the set of semiconductor fins and the second location of the substrate is disposed between adjacent semiconductor fins of the set of semiconductor fins.

19. The integrated circuit structure of claim 18, wherein the first height is less than the second height.

20. The integrated circuit structure of claim 18, wherein the first height is greater than the second height.

* * * * *